(12) United States Patent
Edge et al.

(10) Patent No.: US 8,232,607 B2
(45) Date of Patent: Jul. 31, 2012

(54) BORDERLESS CONTACT FOR REPLACEMENT GATE EMPLOYING SELECTIVE DEPOSITION

(75) Inventors: Lisa F. Edge, Watervliet, NY (US); Balasubramanian S. Haran, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 12/952,372

(22) Filed: Nov. 23, 2010

(65) Prior Publication Data
US 2012/0126295 A1 May 24, 2012

(51) Int. Cl.
H01L 21/02 (2006.01)
(52) U.S. Cl. ......... 257/382; 257/E23.142; 257/E21.577; 438/586
(58) Field of Classification Search .......... 257/382, 257/E23.142, E21.577; 438/586
See application file for complete search history.

(56) References Cited

U.S. PATENT DOCUMENTS

| | | | |
|---|---|---|---|
| 5,470,820 A | 11/1995 | Hauser et al. | |
| 6,027,964 A | 2/2000 | Gardner et al. | |
| 6,448,140 B1 * | 9/2002 | Liaw | 438/279 |
| 6,465,334 B1 | 10/2002 | Buynoski et al. | |
| 6,500,759 B1 | 12/2002 | Asakawa | |
| 6,551,940 B1 | 4/2003 | Ko | |
| 6,602,754 B1 | 8/2003 | Kluth et al. | |
| 6,967,408 B1 | 11/2005 | Ko | |
| 7,026,689 B2 * | 4/2006 | Liaw | 257/368 |
| 7,163,891 B2 * | 1/2007 | Maldei et al. | 438/639 |
| 7,189,652 B1 | 3/2007 | Blosse et al. | |
| 7,256,122 B2 | 8/2007 | Kim | |
| 7,348,230 B2 | 3/2008 | Matsuo et al. | |
| 7,351,628 B2 | 4/2008 | Forbes et al. | |
| 7,649,263 B2 | 1/2010 | Chang et al. | |
| 2011/0156107 A1 * | 6/2011 | Bohr et al. | 257/288 |
| 2011/0298017 A1 * | 12/2011 | Jain et al. | 257/288 |

FOREIGN PATENT DOCUMENTS
WO 2007095438 A2 8/2007

OTHER PUBLICATIONS

Knez, M. et al., "Synthesis and Surface Engineering of Complex Nanostructures by Atomic Layer Deposition" Advanced Materials (2007) pp. 3425-3438, vol. 19.
Moeller, T. et al., "Some Observations on the Electrolyses of Solutions of Rare-Earth Metal Salts in Basic Solvents" Science, Technical Papers (1934) pp. 339.

* cited by examiner

*Primary Examiner* — Trung Q Dang
(74) *Attorney, Agent, or Firm* — Scully, Scott, Murphy & Presser, P.C.; Yuanmin Cai

(57) ABSTRACT

A self-aligned gate cap dielectric can be employed to form a self-aligned contact to a diffusion region, while preventing electrical short with a gate conductor due to overlay variations. In one embodiment, an electroplatable or electrolessly platable metal is selectively deposited on conductive materials in a gate electrode, while the metal is not deposited on dielectric surfaces. The metal portion on top of the gate electrode is converted into a gate cap dielectric including the metal and oxygen. In another embodiment, a self-assembling monolayer is formed on dielectric surfaces, while exposing metallic top surfaces of a gate electrode. A gate cap dielectric including a dielectric oxide is formed on areas not covered by the self-assembling monolayer. The gate cap dielectric functions as an etch-stop structure during formation of a via hole, so that electrical shorting between a contact via structure formed therein and the gate electrode is avoided.

20 Claims, 18 Drawing Sheets

BORDERLESS CONTACT FOR REPLACEMENT GATE EMPLOYING SELECTIVE DEPOSITION

BACKGROUND

The present disclosure relates to semiconductor structures, and particularly to a metal-oxide-semiconductor field effect transistor (MOSFET) having a self-aligned dielectric gate cap and methods of manufacturing the same.

As semiconductor devices shrink in each generation of semiconductor technology, formation of contact structures to source and drain regions of a field effect transistor become challenging because such contact structures not only need to provide reliable electrical contact to the source and drain regions, but also need to avoid electrically shorting to other components such as the gate electrode of the field effect transistor. Since the etch chemistry employed for the anisotropic etch process remains the same while the lateral dimension of the dielectric gate spacer shrinks with the scaling of semiconductor devices, the likelihood of overlay variations during lithographic processes causing formation of contact structures that electrically short a source/drain region to a gate conductor of a field effect transistor increases in each generation.

Nonetheless, contact structures to source and drain regions must avoid electrically shorting to gate conductors to provide a functional field effect transistor. Thus, the possibility of electrically shorting source/drain regions to a gate conductor of a field effect transistor is a significant concern for product yield and reliability purposes.

BRIEF SUMMARY

A self-aligned gate cap dielectric can be employed to form a self-aligned contact to a diffusion region of a semiconductor device, while preventing electrical short with a gate conductor due to overlay variations. In one embodiment, an electroplatable or electrolessly platable metal is selectively deposited on conductive materials in a gate electrode, for example, by electroplating or electroless plating, while the metal is not deposited on dielectric surfaces. The metal portion on top of the gate electrode is converted into a gate cap dielectric including the metal and oxygen, for example, by anodization or oxidation. In another embodiment, a self-assembling monolayer is formed on dielectric surfaces, while exposing metallic top surfaces of a gate electrode. A gate cap dielectric including a dielectric oxide is formed, for example, by atomic layer deposition (ALD) on areas not covered by the self-assembling monolayer. The self-assembling monolayer is subsequently removed. After formation of the gate cap dielectric, a contact-level dielectric layer is deposited over the gate cap dielectric, and at least one via hole is formed around the gate electrode. The gate cap dielectric functions as an etch-stop structure during formation of the via hole, so that a contact via structure formed therein is self-aligned away from the gate electrode, preventing electrical short to the gate electrode.

According to an aspect of the present disclosure, a method of forming a semiconductor structure includes: forming a gate electrode and a planarization dielectric layer on a semiconductor substrate, wherein a top metallic surface of the gate electrode is coplanar with a top surface of the planarization dielectric layer; selectively forming a gate cap dielectric on the top metallic surface of the gate electrode, while the gate cap dielectric is not formed on or above the planarization dielectric layer; forming a contact-level dielectric layer over the gate cap dielectric and the planarization dielectric layer; and forming a via hole through the contact-level dielectric layer over a periphery of the gate cap dielectric, wherein a first portion of the via hole does not extend below the gate cap dielectric where the gate cap dielectric is present, and a second portion of the via hole extends into the planarization dielectric layer where the gate cap dielectric is not present.

According to another aspect of the present disclosure, a semiconductor structure includes: a gate electrode located on a semiconductor substrate; a planarization dielectric layer laterally surrounding the gate electrode; a gate cap dielectric including an oxide of a transition metal; a contact-level dielectric layer overlying the planarization dielectric layer and the gate cap dielectric; and a contact via structure extending through the contact-level dielectric layer and the planarization dielectric layer, contacting an upper surface of a peripheral portion of the gate cap dielectric, and spaced from the gate electrode by the gate cap dielectric.

DETAILED DESCRIPTION

Figure 1:
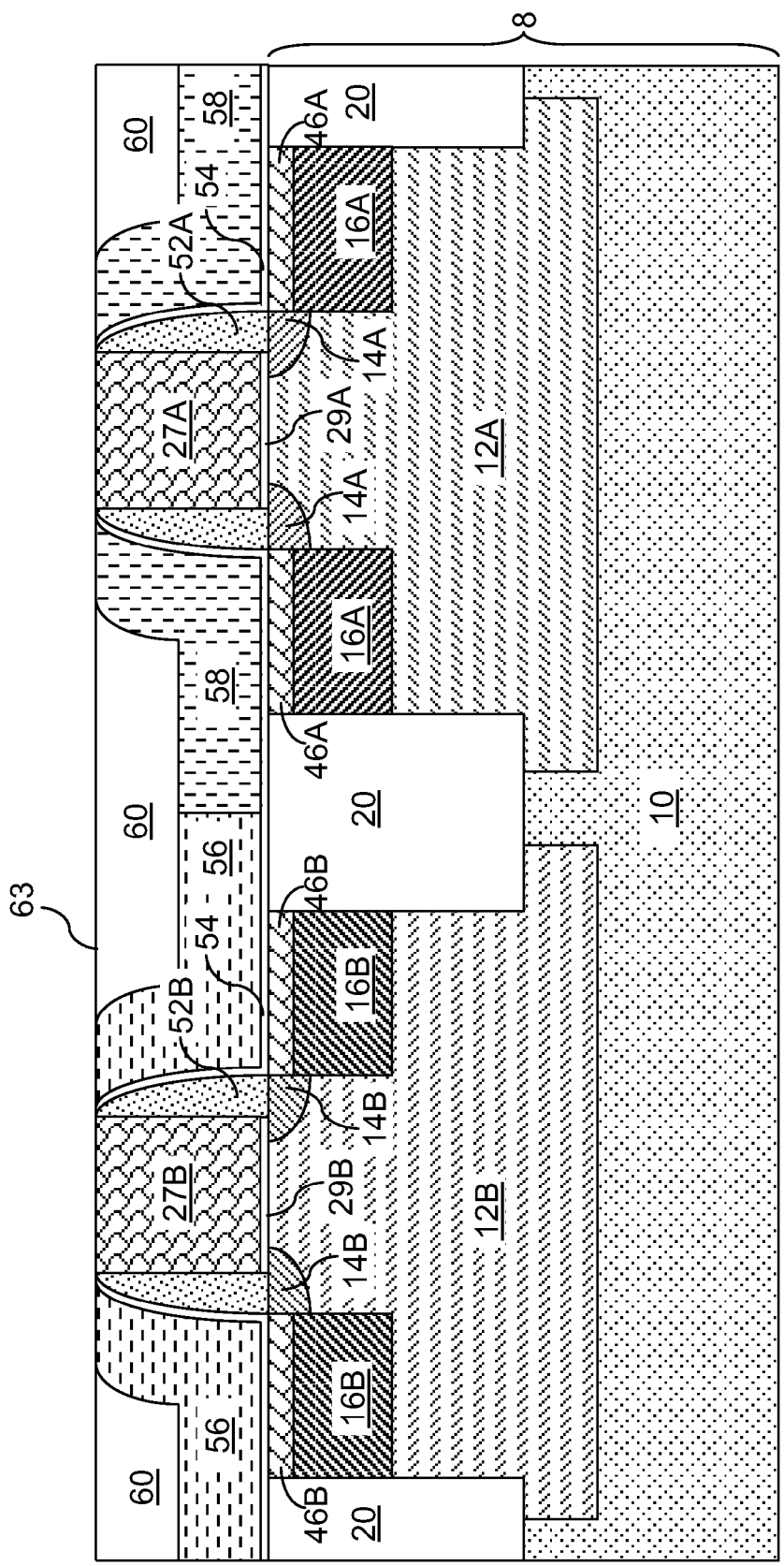
FIG. 1 is vertical cross-sectional view of a first exemplary semiconductor structure after formation of disposable gate structures and formation of a planar dielectric surface on a planarization dielectric layer according to an embodiment of the present disclosure.

As stated above, the present disclosure relates to semiconductor structures having dual work function metal gates and a high-k gate dielectric, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of p-type or n-type at different dopant concentration levels. For example, the semiconductor substrate 8 may include an underlying semiconductor layer 10, a first conductivity type well 12B, and a second-conductivity type well 12A. The first conductivity type well 12B is doped with electrical dopants of a first conductivity type, which can be p-type or n-type. The second conductivity type well 12A is doped with electrical dopants of a second conductivity type, which is the opposite type of the first conductivity type. For example, if the first conductivity type is p-type, the second conductivity type is n-type, and vice versa.

Shallow trench isolation structures 20 are formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20.

A disposable dielectric layer and a disposable gate material layer are deposited and lithographically patterned to form disposable gate structures. For example, the disposable gate stacks may include a first disposable gate structure that is a stack of a first disposable dielectric portion 29A and a first disposable gate material portion 27A and a second disposable gate structure that is a stack of a second disposable dielectric portion 29B and a second disposable gate material portion 27B. The disposable dielectric layer includes a dielectric material such as a semiconductor oxide. The disposable gate material layer includes a material that can be subsequently removed selective to dielectric material such as a semiconductor material. The first disposable gate structure (29A, 27A) is formed over the second conductivity type well 12A, and the second disposable gate structure (29B, 27B) is formed over the first conductivity type well 12B. The height of the first disposable gate structure (29A, 27A) and the second disposable gate structure (29B, 27B) can be from 20 nm to 500 nm, and typically from 40 nm to 250 nm, although lesser and greater heights can also be employed.

Dopants of the first conductivity type are implanted into portions of the second conductivity type well 12A that are not covered by the first disposable gate structure (29A, 27A) to form first source and drain extension regions 14A. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (29B, 27B) to form second source and drain extension regions 14B. The second conductivity type well 12A can be masked by a photoresist (not shown) during the implantation of the second conductivity type dopants to prevent implantation of the second conductivity type dopants therein.

Dielectric gate spacers are formed on sidewalls of each of the disposable gate structures, for example, by deposition of a conformal dielectric material layer and an anisotropic etch. The dielectric gate spacers include a first dielectric gate spacer 52A formed around the first disposable gate structure (29A, 27A) and a second dielectric gate spacer 52B formed around the second disposable gate structure (29B, 27B).

Dopants of the first conductivity type are implanted into portions of the second conductivity type well 12A that are not covered by the first disposable gate structure (29A, 27A) and the first dielectric gate spacer 52A to form first source and drain regions 16A. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (29B, 27B) and the second dielectric gate spacer 52B to form second source and drain regions 16B. The second conductivity type well 12A can be masked by a photoresist (not shown) during the implantation of the second conductivity type dopants to prevent implantation of the second conductivity type dopants therein.

In some embodiments, the first source and drain regions 16A and/or the second source and drain regions 16B can be formed by replacement of the semiconductor material in the second conductivity type well 12A and/or the semiconductor material in the first conductivity type well 12B with a new semiconductor material having a different lattice constant. In this case, the new semiconductor material(s) is/are typically epitaxially aligned with (a) single crystalline semiconductor material(s) of the second conductivity type well 12A and/or the semiconductor material in the first conductivity type well 12B, and apply/applies a compressive stress or a tensile stress to the semiconductor material of the second conductivity type well 12A and/or the semiconductor material in the first conductivity type well 12B between the first source and drain extension regions 14A and/or between the second source and drain extension regions 14B.

First metal semiconductor alloy portions 46A and second metal semiconductor alloy portions 46B are formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and second source and drain regions (16A, 16B) include silicon.

Optionally, a dielectric liner 54 may be deposited over the metal semiconductor alloy portions 54, the first and second disposable gate structures (29A, 27A, 29B, 27B), and the first and second dielectric gate spacers (52A, 52B). A first type stress-generating liner 58 and a second type stress-generating liner 56 can be formed over the first disposable gate structure (29A, 27A) and the second disposable gate structure (29B, 27B), respectively. The first type stress-generating liner 58 and/or the second type stress-generating liner 56 can be employed to apply uniaxial or biaxial lateral stress to a first channel region, which is the portion of the second conductivity type well 12A between the first source and drain extension regions 14A, and/or to a second channel region, which is the portion of the first conductivity type well 12B between the second source and drain extension regions 14B, respectively. In one embodiment, one of the first type stress-generating liner 58 and the second type stress-generating liner 56 applies a compressive stress if underlying source and drain regions (i.e., the first source and drain regions 16A or the second source and drain regions 16B) are p-doped regions, and the other of the first type stress-generating liner 58 or the second type stress-generating liner 56 applies a tensile stress if underlying source and drain regions (i.e., the second source and drain regions 16B and the first source and drain regions 16A) are n-doped regions. The first type stress-generating liner 58 and the second type stress-generating liner 56 can include a dielectric material that generates a compressive stress or a tensile stress to underlying structures, and can be silicon nitride layers deposited by plasma enhanced chemical vapor deposition under various plasma conditions.

A planarization dielectric layer 60 is deposited over the first type stress-generating liner 58 and/or the second type stress-generating liner 56, if present, or over the metal semiconductor alloy portions 54, the first and second disposable gate structures (29A, 27A, 29B, 27B), and the first and second dielectric gate spacers (52A, 52B) if (a) stress-generating liner(s) is/are not present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60, the first type stress-generating liner 58 and/or the second type stress-generating liner 56 (if present), and the dielectric liner 54 (if present) are planarized above the topmost surfaces of the first and second disposable gate structures (29A, 27A, 29B, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

In one embodiment, the first conductivity type is p-type and the second conductivity type is n-type. The first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. Correspondingly, the first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an second field effect transistor. The first type stress-generating liner 58 can apply a tensile stress to the first channel, and the second type stress-generating liner 56 can apply a compressive stress to the second channel.

In another embodiment, the first conductivity type is n-type and the second conductivity type is p-type. The first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. Correspondingly, the first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a first field effect transistor. The first type stress-generating liner 58 can apply a compressive stress to the first channel, and the second type stress-generating liner 56 can apply a tensile stress to the second channel.

Figure 2:
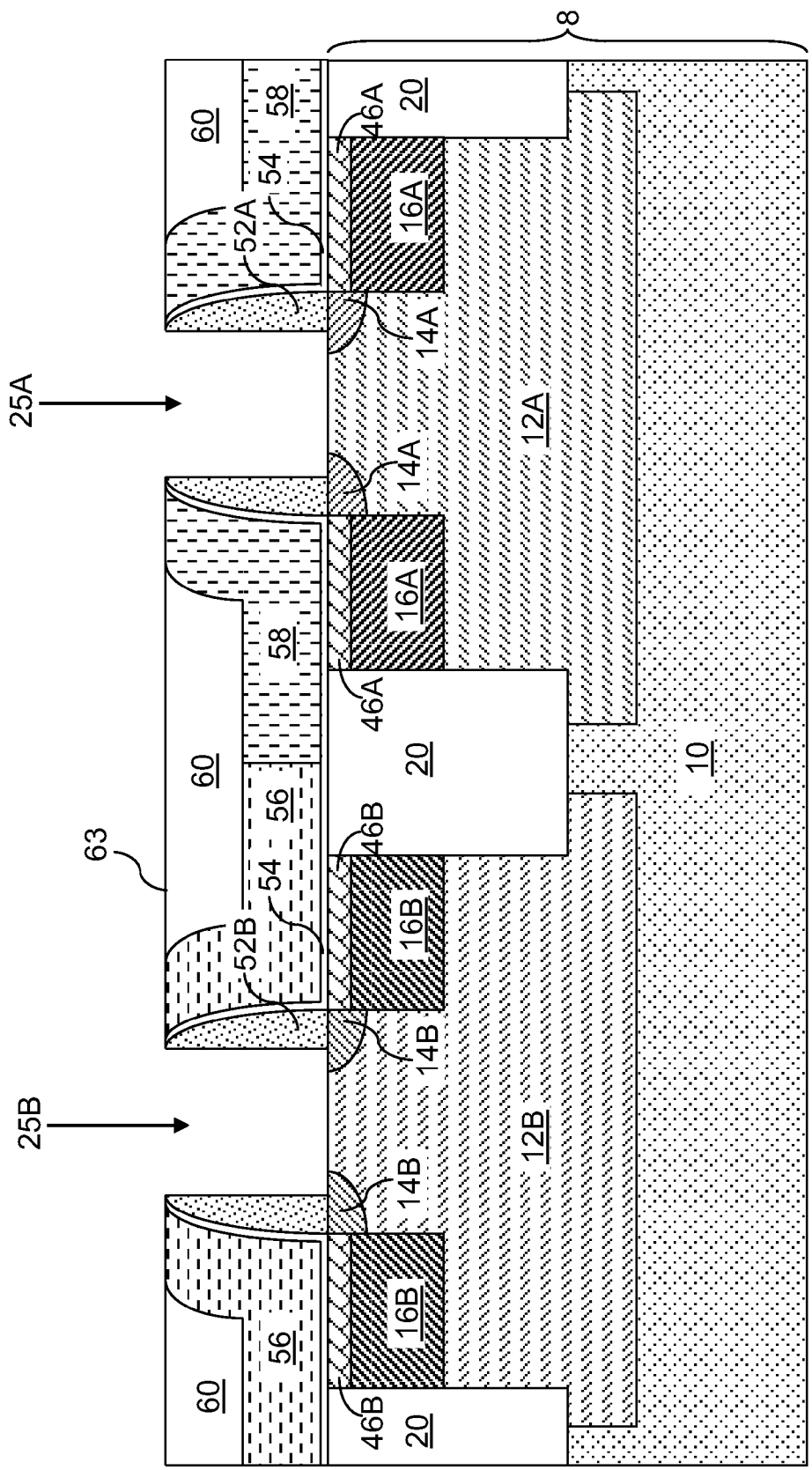
FIG. 2 is a vertical cross-sectional view of the first exemplary semiconductor structure of FIG. 1 after removal of the disposable gate structures.

Referring to FIG. 2, the first disposable gate structure (29A, 27A) and the second disposable gate structure (29B, 27B) are removed by at least one etch. The at least one etch can be a recess etch, which can be an isotropic etch or anisotropic etch. The etch employed to remove the first and second disposable gate material portions (27A, 27B) is preferably selective to the dielectric materials of the planarization dielectric layer 60, the first type stress-generating liner 58 and/or the second type stress-generating liner 56 (if present), and the first and second dielectric gate spacers (52A, 52B). Optionally, one or both of the dielectric portions (29A, 29B) can be left by etch selective to these layers. The disposable gate structures (29A, 27A, 29B, 27B) are recessed below the planar dielectric surface 63 and to expose the semiconductor surfaces above the first channel and the second channel to form gate cavities (25A, 25B) over the semiconductor substrate 8.

Optionally, a first semiconductor-element-containing dielectric layer 31A can be formed on the exposed surface of the second conductivity type well 12A by conversion of the exposed semiconductor material into a dielectric material, and a second semiconductor-element-containing dielectric layer 31B can be formed on the exposed surface of the first conductivity type well 12B by conversion of the exposed semiconductor material into the dielectric material. The formation of the semiconductor-element-containing dielectric layers (31A, 31B) can be effected by thermal conversion or plasma treatment. If the semiconductor material of the second conductivity type well 12A and the first conductivity type well 12B includes silicon, the semiconductor-element-containing dielectric layers (31A, 31B) can include silicon oxide or silicon nitride. The semiconductor-element-containing dielectric layers (31A, 31B) are interfacial dielectric layers that contact a semiconductor surface underneath and gate dielectrics to be subsequently deposited thereupon.

Figure 3:
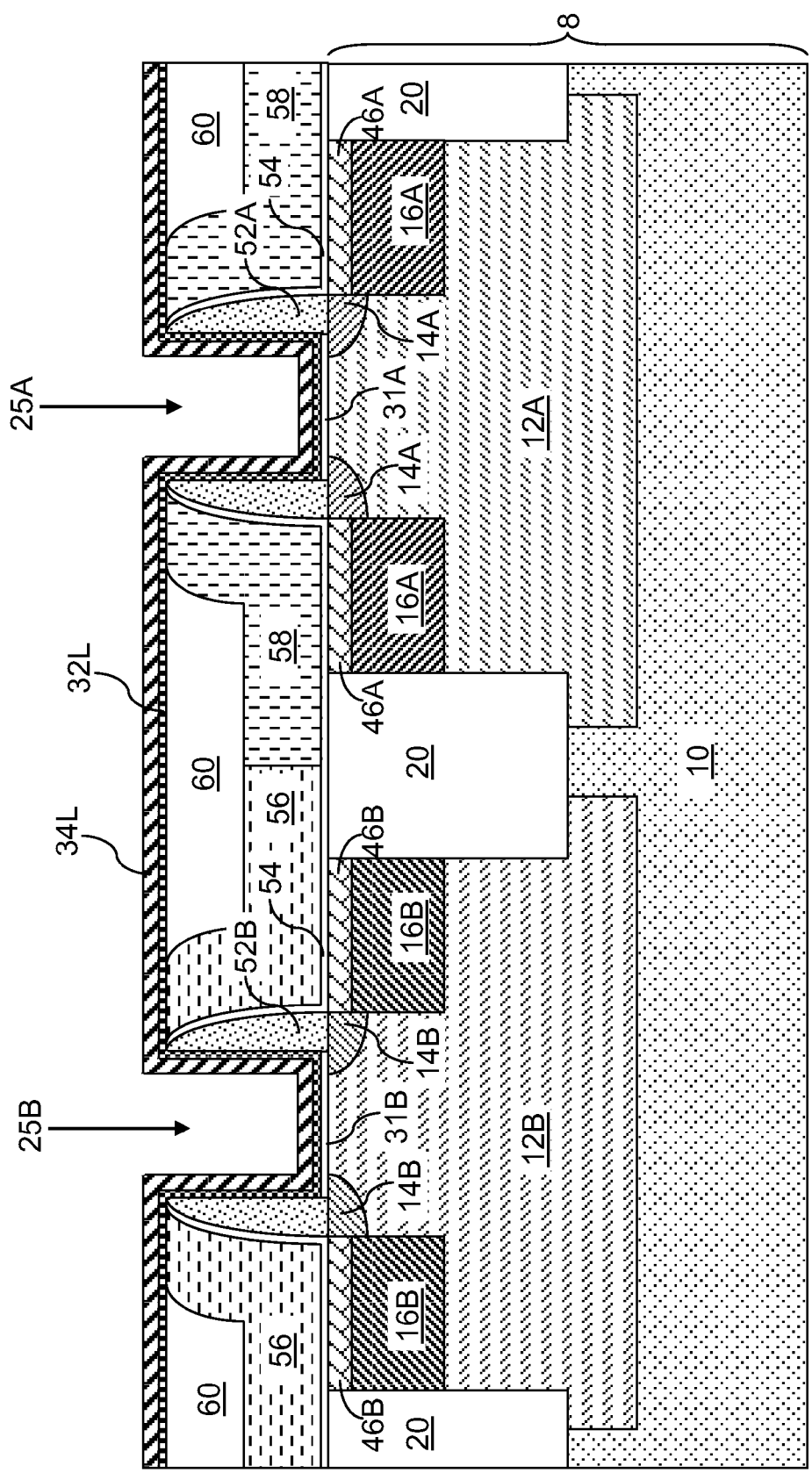
FIG. 3 is a vertical cross-sectional view of the first exemplary semiconductor structure of FIG. 2 after formation of a first-type work function material layer.

Referring to FIG. 3, a contiguous gate dielectric layer 32L and a first-type work function metal layer 34L including a first metal having a first work function are sequentially formed for form a stack, from bottom to top, of the contiguous gate dielectric layer 32L and the first-type work function metal layer 34L. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The high-k material layer 32L may have an effective oxide thickness on the order of or less than 1 nm.

The first-type work function metal layer 34L includes a first metal, which has a first work function. The first metal of the first-type work function metal layer 34L is selected to optimize the performance of a transistor to be subsequently formed employing the first source and drain extension regions 14A, the first source and drain regions 16A, and the second conductivity type well 12A.

In one embodiment, the first conductivity type is p-type and the semiconductor material of the second conductivity type well 12A includes n-doped silicon, and the first-type work function metal layer 34L includes a silicon valence band edge metals such as Pt, Rh, Ir, Ru, Cu, Os, Be, Co, Pd, Te, Cr, Ni, TiN, and alloys thereof. A silicon valence band edge metal is a metal having a work function that is closer to the work function corresponding to the valence band edge of silicon, i.e., 5.10 eV, than to the work function corresponding to the conduction band edge of silicon, i.e., 4.00 eV. Thus, a silicon valence band edge metal has a work function that is greater than 4.55 eV. For example, the first-type work function metal layer 34L can be a layer of TiN.

In another embodiment, the first conductivity type is n-type and the semiconductor material of the second conductivity type well 12A includes p-doped silicon, and the first-type work function metal layer 34L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. A silicon conduction band edge metal is a metal having a work function that is closer to the work function corresponding to the conduction band edge of silicon than to the work function corresponding to the valence band edge of silicon. Thus, a silicon conduction band edge metal has a work function that is less than 4.55 eV. For example, the first-type work function metal layer 34L can be a layer of TiAl.

The first-type work function metal layer 34L can be formed, for example, by physical vapor deposition, chemical vapor deposition, or atomic layer deposition (ALD). The thickness of the first-type work function metal layer 34L is typically set at a value from 1 nm to 30 nm, and more typically, from 2 nm to 10 nm, although lesser and greater thicknesses can also be employed.

Figure 4:
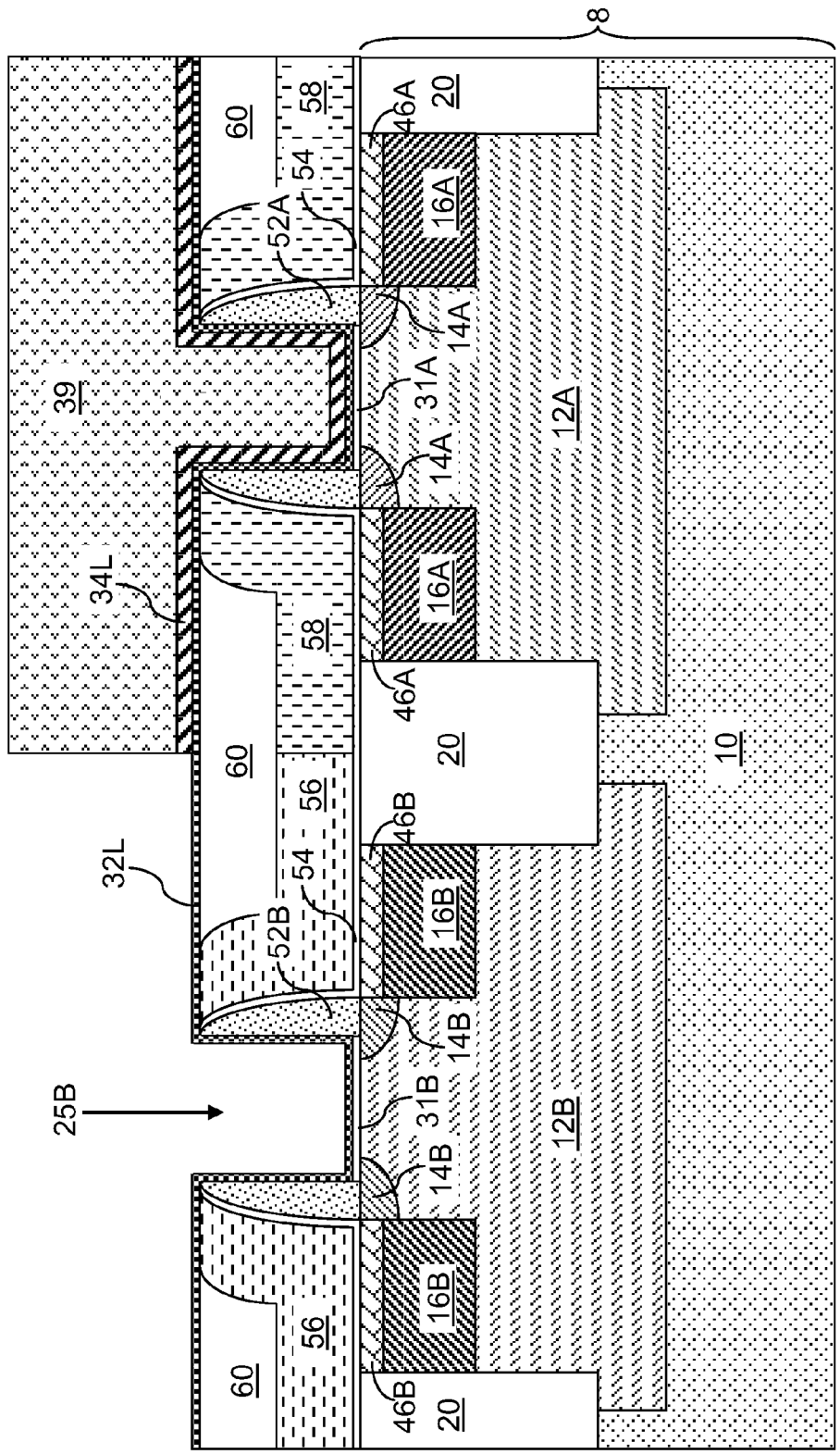
FIG. 4 is a vertical cross-sectional view of the first exemplary semiconductor structure of FIG. 3 after application of a photoresist and lithographic patterning of the first-type work function material layer.

Referring to FIG. 4, a first photoresist 39 is applied and lithographic patterned so that the first photoresist 39 covers the area over the second conductivity type well 12A, while the top surface of the first-type work function metal layer 34L is exposed over the first conductivity type well 12B. The pattern in the first photoresist 39 is transferred into the first-type work function metal layer 34L by an etch. The portion of the first-type work function metal layer 34L within the second gate cavity 25B is removed employing the first photoresist 39 as an etch mask. The first photoresist 39 is removed, for example, by ashing or wet etching. After the patterning of the first-type work function metal layer 34L, the first-type work function metal layer 34L is present in the first gate cavity 25A (See FIG. 4), but is not present in the second gate cavity 25B.

Figure 5:
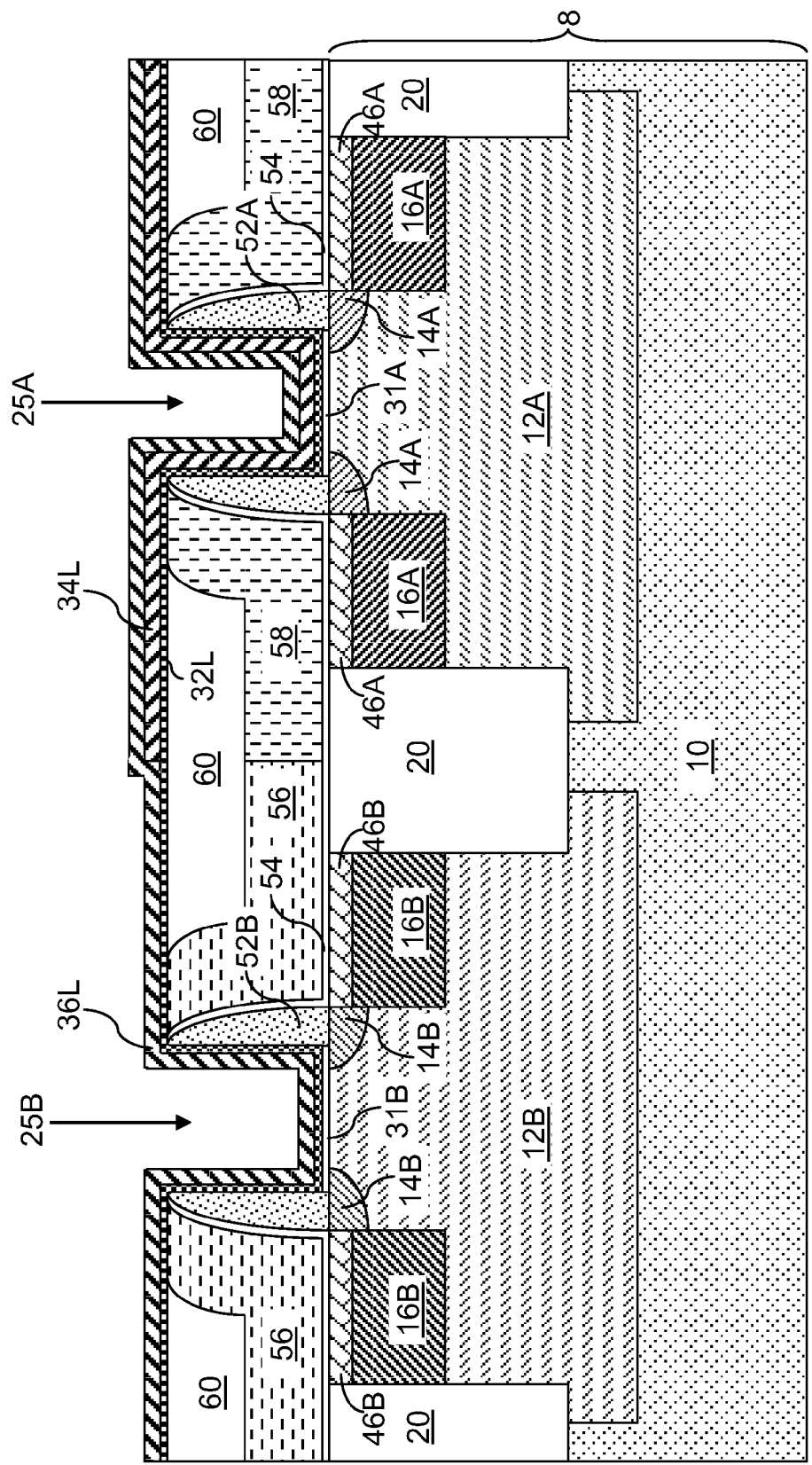
FIG. 5 is a vertical cross-sectional view of the first exemplary semiconductor structure of FIG. 4 after removal of the photoresist and formation of a second-type work function material layer.

Referring to FIG. 5, a second-type work function metal layer 36L is deposited. The second-type work function metal layer 36L includes a second metal having a second work function, which is different from the first work function. The second metal of the second-type work function metal layer 36L is selected to optimize the performance of a transistor to be subsequently formed employing the second source and drain extension regions 14B, the second source and drain regions 16B, and the first conductivity type well 12B.

In one embodiment, the second conductivity type is n-type and the semiconductor material of the first conductivity type well 12B includes p-doped silicon, and the second-type work function metal layer 36L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second-type work function metal layer 36L can be a layer of TiAl.

In another embodiment, the second conductivity type is p-type and the semiconductor material of the first conductivity type well 12B includes n-doped silicon, and the second-type work function metal layer 36L includes a silicon valence band edge metals such as Pt, Rh, Ir, Ru, Cu, Os, Be, Co, Pd, Te, Cr, Ni, TiN, and alloys thereof. For example, the second-type work function metal layer 36L can be a layer of TiN.

The second-type work function metal layer 36L can be formed, for example, by physical vapor deposition, chemical vapor deposition, or atomic layer deposition (ALD). The thickness of the second-type work function metal layer 34L is typically set at a value from 2 nm to 100 nm, and more typically, from 3 nm to 10 nm, although lesser and greater thicknesses can also be employed.

In general, one of the first and second work functions is closer to the conduction band of the semiconductor material of the first conductivity type well 12B and the second conductivity type well 12A than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

Figure 6:
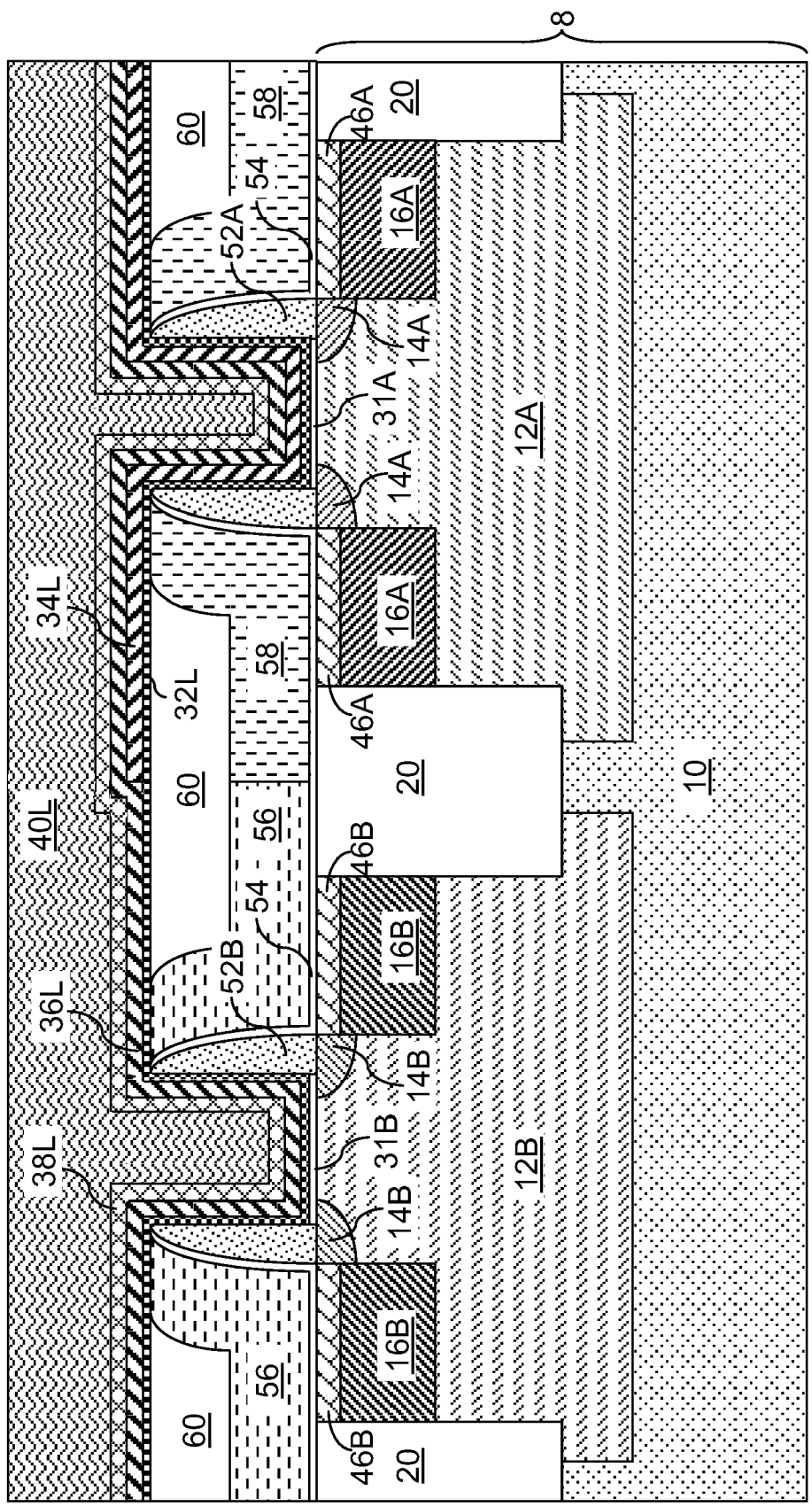
FIG. 6 is a vertical cross-sectional view of the first exemplary semiconductor structure of FIG. 5 after deposition of at least one metallic barrier layer and a conductive metal layer.

Referring to FIG. 6, an optional barrier metal layer 38L can be deposited on the second-type work function metal layer 36L. In a non-limiting illustrative example, the optional barrier metal layer 38L can include a tantalum nitride layer, a titanium nitride layer, a titanium-aluminum alloy, or a combination thereof. The thickness of the optional barrier metal layer 38L can be from 0.5 nm to 20 nm, although lesser and greater thicknesses can also be employed. The optional barrier metal layer 38L may be omitted in some embodiments. In one embodiment, the optional barrier metal layer 38L includes a metallic nitride. For example, the optional barrier metal layer 38L can include titanium nitride.

A conductive metal layer 40L is deposited on the optional barrier metal layer 38L or on the second-type work function metal layer 36L. The conductive metal layer 40L can include a conductive material deposited by physical vapor deposition or chemical vapor deposition. For example, the conductive metal layer 40L can be an aluminum layer or an aluminum alloy layer deposited by physical vapor deposition. The thickness of the conductive metal layer 40L, as measured in a planar region of the conductive metal layer 40L above the top surface of the planarization dielectric layer 60, can be from 100 nm to 500 nm, although lesser and greater thicknesses can also be employed. In one embodiment, the conductive metal layer 40 consists essentially of a single elemental metal such as Al, Au, Ag, Cu, or W. For example, the conductive metal layer can consist essentially of aluminum.

At the end of the processing step of FIG. 6, a material layer stack is formed, which includes, from bottom to top, the contiguous gate dielectric layer 32L which is a gate dielectric layer, the first-type work function metal layer 34L, the second-type work function metal layer 36L, the optional barrier metal layer 38L, if present, and the conductive metal layer 40L. The portion of the material layer stack in the first device region includes the first-type work function metal layer 34L and a portion of the second-type work function metal layer 36L. The portion of the material layer stack in the second device region includes another portion of the second-type work function metal layer 36L, but does not include any portion of the first-type work function metal layer 34L. The material layer stack is present over the top surface of the planarization dielectric layer 60 at this step.

Figure 7:
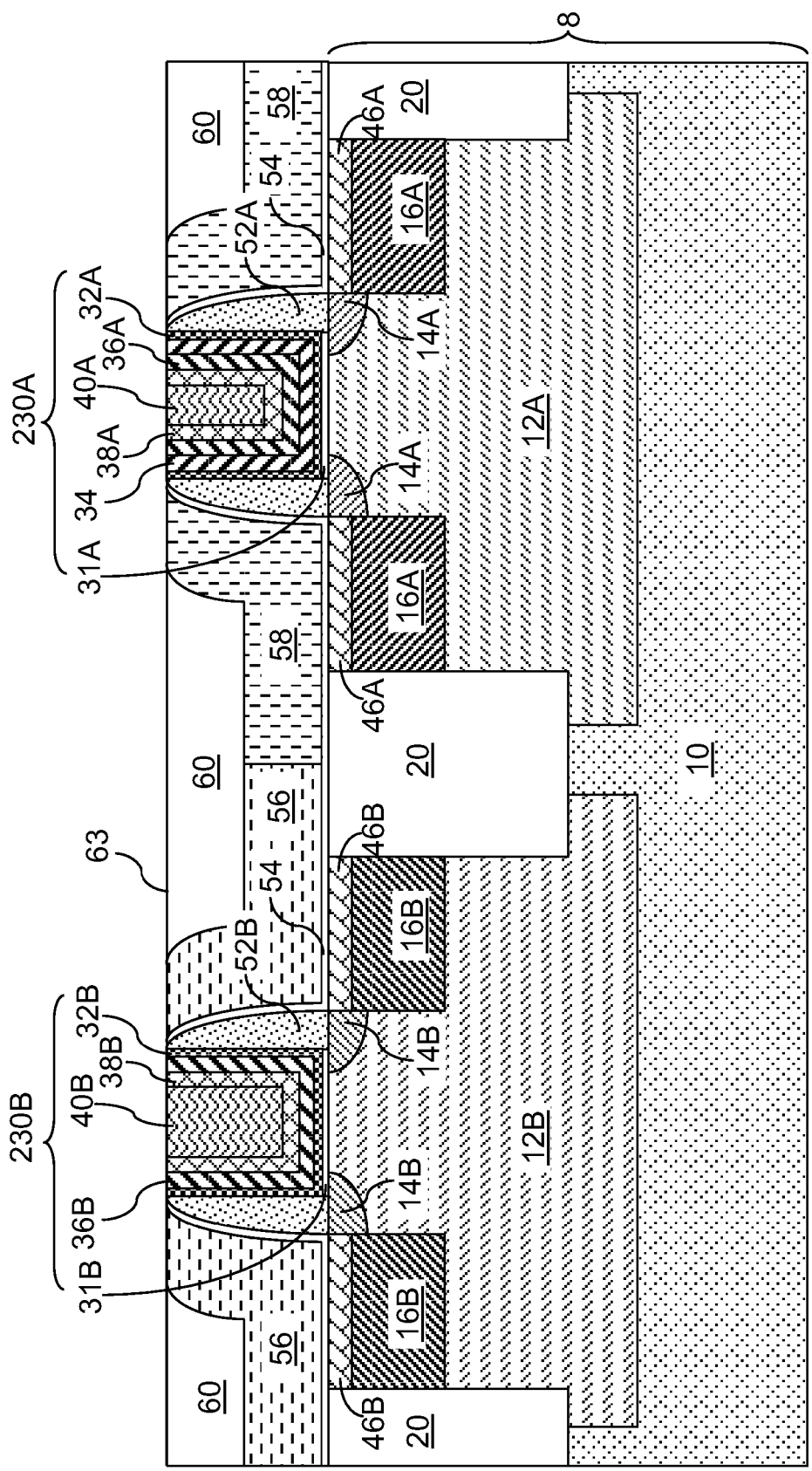
FIG. 7 is a vertical cross-sectional view of the first exemplary structure of FIG. 6 after planarization.

Referring to FIG. 7, portions of the gate conductor layer 40L, the optional barrier metal layer 38L, the second-type work function metal layer 36L, the first-type work function metal layer 34L, and the contiguous gate dielectric layer 32L are removed from above the planar dielectric surface 63 of the planarization dielectric layer 60 by employing a planarization process. Replacement gate stacks are formed by removing portions of the material layer stack from above a source region and a drain region of each field effect transistor. The replacement gate stacks include a first replacement gate stack 230A located in the first device region and a second replacement gate stack 230B located in the second device region. Each replacement gate stack (230A, 230B) overlies a channel region of a field effect transistor. The first replacement gate stack 230A and the second replacement gate stack 230B are formed concurrently.

A first field effect transistor is formed in the first device region. The first field effect transistor includes the p-type well 12A, the first source and drain extension regions 14A, the first source and drain regions 16A, first metal semiconductor alloy portions 46A, and a first replacement gate stack 230A. The first replacement gate stack 230A includes the optional first semiconductor-element-containing dielectric layer 31A, a first gate dielectric 32A which is a remaining portion of the contiguous gate dielectric layer 32L in the first device region, and a first gate electrode. The first gate electrode includes a first-type work function metal portion 34 which is a remaining portion of the first-type work function metal layer 34L, a metallic material portion 36A which is a remaining portion of the second-type work function metal layer 36L in the first device region, a first optional barrier metal portion 38A which is a remaining portion of the optional barrier metal layer 38L, and a first gate conductor portion 40A which is a remaining portion of the gate conductor layer 40L.

A second field effect transistor is formed in the second device region. The second field effect transistor includes the n-type well 12B, the n-type source and drain extension regions 14B, the n-type source and drain regions 16B, a second metal semiconductor alloy portions 46B, and a second replacement gate stack 230B. The second replacement gate stack 230B includes the optional second semiconductor-element-containing dielectric layer 31B, a second gate dielectric 32B which is a remaining portion of the contiguous gate dielectric layer 32L in the second device region, and a second gate electrode. The second gate electrode includes a second-type work function metal portion 36B which is a remaining portion of the second-type work function metal layer 36L in the second device region, a second optional barrier metal portion 38B which is a remaining portion of the optional barrier metal layer 38L, and a second gate conductor portion 40B which is a remaining portion of the gate conductor layer 40L. The metallic material portion 36A in the first replacement gate stack 230A and the second-type work function metal portion 36B in the second replacement gate stack 230B have the same material composition and the same thickness.

Each of the first and second gate dielectrics (32A, 32B) is a U-shaped gate dielectric having a dielectric constant greater than 8.0. Each U-shaped gate dielectric includes a horizontal gate dielectric portion and a vertical gate dielectric portion extending upward from peripheral regions of the horizontal gate dielectric portion. In the first field effect transistor, the first-type work function metal portion 34 contacts inner sidewalls of the vertical gate dielectric portion of the first gate dielectric 32A. In the second field effect transistor, the second-type work function metal portion 36B contacts inner sidewalls of the vertical gate dielectric portion of the second gate dielectric 32B.

All top metallic surfaces of each of the first gate electrode (34, 36A, 38A, 40A) and the second gate electrode (36B, 38B, 40B) is coplanar with the top surface of the planarization dielectric layer 60, i.e., the planar dielectric surface 63. The disposable gate structures are replaced with the first and second replacement gate structures (230A, 230B) each including a gate dielectric (32A, 32B) and a gate electrode including at least one conductive material portion. Each gate electrode is a remaining portion of the at least one conductive material after removing the at least one conductive material from above a top surface of the planarization dielectric layer. A dielectric gate spacer (52A or 52B) laterally surrounds each gate electrode.

Figure 8:
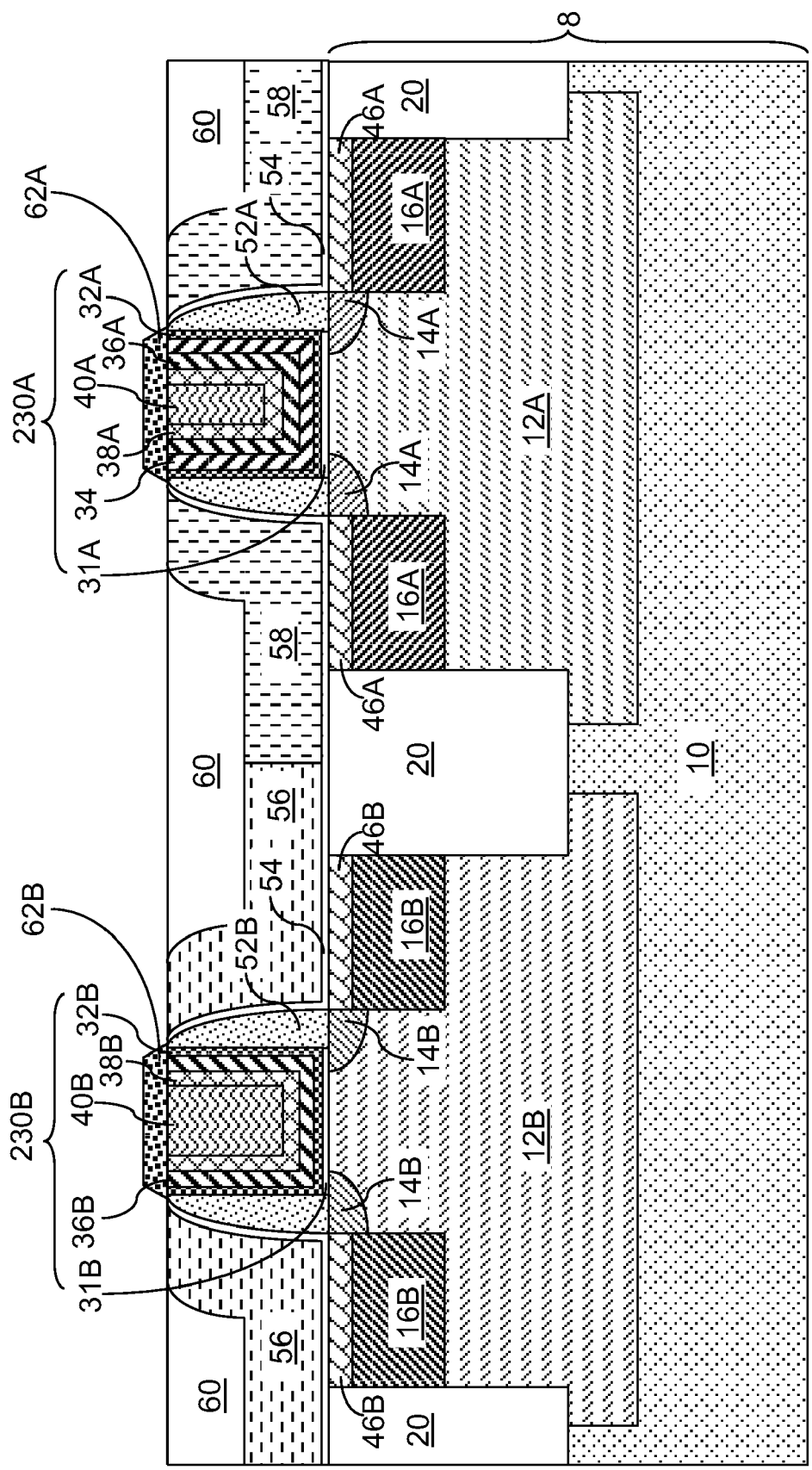
FIG. 8 is a vertical cross-sectional view of the first exemplary semiconductor structure of FIG. 7 after selective deposition of metal portions.

Referring to FIG. 8, a metal portion is selectively formed on each of the first and second replacement gate structures (230A, 230B) by electroplating or electroless plating. Specifically, a first metal portion 62A is selectively deposited on exposed metallic surfaces of the first replacement gate structure 230A, and a second metal portion 62B is selectively deposited on exposed metallic surfaces of the second replacement gate structure 230B. Electroplating is a plating process that uses electrical current to reduce cations of a material from a solution and deposit a conductive layer including the material. Electroless plating is a non-galvanic type of plating method that involves several simultaneous reactions in an aqueous solution without the use of external electrical power and results in formation of a deposited conductive layer. Electroplating and electroless plating occurs only on conductive surfaces such as the metallic top surfaces of the replacement gate structures (230A, 230B), but does not occur on any dielectric surface such as the top surface of the planarization dielectric layer 60.

The material of the metal portions (62A, 62B) is subjected to two requirements. First, the material of the metal portions (62A, 62B) needs to be electroplated or electrolessly plated. Thus, only a material that can be electroplated or electrolessly plated can be employed for the metal portions (62A, 62B). Second, the material of the metal portions (62A, 62B) needs to be capable of conversion into a dielectric oxide at a temperature that does not affect the properties of the first and second gate dielectrics (32A, 32B) in order to prevent the degradation of the dielectric material in the first and second gate dielectrics (32A, 32B), especially if the first and second gate dielectrics (32A, 32B) includes a high dielectric constant material including a dielectric metal oxide having a dielectric constant greater than 8.0. The conversion into a dielectric oxide needs to proceed not only at the exposed surface, but needs to proceed throughout the bulk portion of the metal.

Not many metals satisfy the dual requirement of selective deposition by electroplating or electroless plating and oxidizability at low temperatures, e.g., below 500° C. In general, most transition metals other than Lanthanides and Actinides are not suitable for the material for the metal portions (62A, 62B) because of these transition metals are not easily oxidized by oxidation processes at low temperatures or by anodization. As used herein, "transition metals" include all elemental metals in Group IB, IIB, IIIB, IVB, VB, VIIB, VIIB, and VIIIB and includes Lanthanides and Actinides. W, Re, Ta, and Mo, which are four of the five refractory metals, are an exception in that W, Re, Ta, and Mo can be converted into a metal oxide by anodization. Further, yttrium (Y) is another exception in that yttrium can be easily oxidized at a low temperature.

While Lanthanides and Actinides in general are easily oxidizable, electroplating or electroless plating of Lanthanides and Actinides are in general difficult. See Moeller T. and Zimmerman P., Some Observations on the Electrolyses of Solutions of Rare-Earth metal Salts in Basic Solvents, Science, October 339 (1954). However, Moeller et al. reports that two Lanthanides including Nd and La are exceptions to the general trend, and can be electroplated or electrolessly plated.

Thus, the metal portions (62A, 62B) can include a material selected from Y, La, Nd, W, Re, Ta, and Mo. The thickness of the metal portions (62A, 62B) at the thickest point can be from 1 nm to 20 nm, although lesser and greater thicknesses can also be employed.

Figure 9:
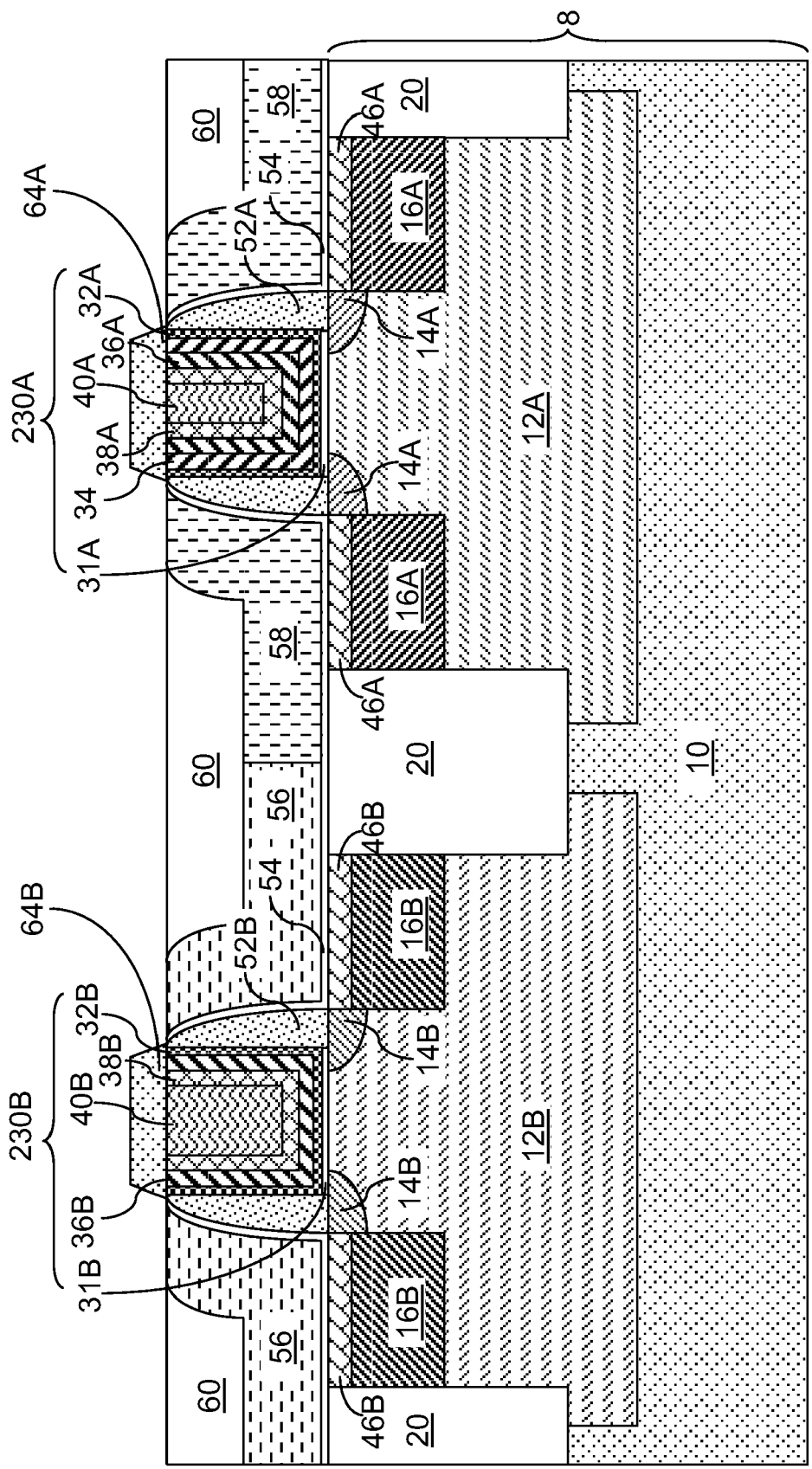
FIG. 9 is a vertical cross-sectional view of the first exemplary structure of FIG. 8 after conversion of the metal portions into gate cap dielectric portions.

Referring to FIG. 9, the metal portions (62A, 62B) are converted into gate cap dielectric portions (64A, 64B) by oxidation or anodization. The gate cap dielectric portions (64A, 64B) include a first gate cap dielectric portion 64A derived from the first metal portion 62A and a second gate cap dielectric portion 64B derived from the second metal portion 62B.

In one embodiment, the gate cap dielectric portions (64A, 64B) are formed by subjecting the metal portions (62A, 62B) to an anodization process. In general, an anodization process is an electrolytic passivation process used to increase the thickness of the natural oxide layer on the surface of metal parts. The metal portions (62A, 62B) and the gate electrodes (34, 36A, 38A, 40A, 36B, 38B, 40B) form the anode electrode of an electrical circuit during the anodization process. A cathode electrode (not shown) is an external electrode, which is immersed into the same electrolytic solution as the metal portions (62A, 62B) during the anodization process. At the end of the anodization, the entirety of a predominant portion of each metal portion (62A, 62B) is converted into the gate cap dielectric portions (64A, 64B).

In another embodiment, the gate cap dielectric portions (64A, 64B) are formed by thermal oxidation or plasma oxidation of the metal portions (62A, 62B). The metal portions (62A, 62B) are subjected to an oxidizing environment, either in the presence of an oxidizing gas such as oxygen or ozone or in the presence of oxygen plasma, at a temperature that does not exceed 500° C. At the end of the oxidation process, the entirety of a predominant portion of each metal portion (62A, 62B) is converted into the gate cap dielectric portions (64A, 64B).

If the metal portions (62A, 62B) are portions of an elemental metal selected from Y, La, Nd, W, Re, Ta, and Mo, the gate cap dielectric portions (64A, 64B) include a material selected from yttrium oxide, lanthanum oxide, neodymium oxide, tungsten oxide, rhenium oxide, tantalum oxide, and molybdenum oxide. The thickness of the gate cap dielectric portions (64A, 64B) increases from the thickness of the metal portions (62A, 62B) with incorporation of oxygen atoms, and can be from 2 nm 40 nm, although lesser and greater thicknesses can also be employed. Because the metal portions (62A, 62B) are not present on or above the planarization dielectric layer 60, the gate cap dielectrics (64A, 64B) are not formed on or above the planarization dielectric layer 60. The gate cap dielectrics (64A, 64B) can be laterally spaced from the planarization dielectric layer 60 so that the gate cap dielectrics (64A, 64B) do not contact the planarization dielectric layer. The gate cap dielectrics (64A, 64B) may, or may not, contact the stress-generating liners (56, 58) depending on the lateral extent of the gate cap dielectrics (64A, 64B) and the thicknesses of the top portion of dielectric gate spacers (52A, 52B) and the dielectric liner 54.

Figure 10:
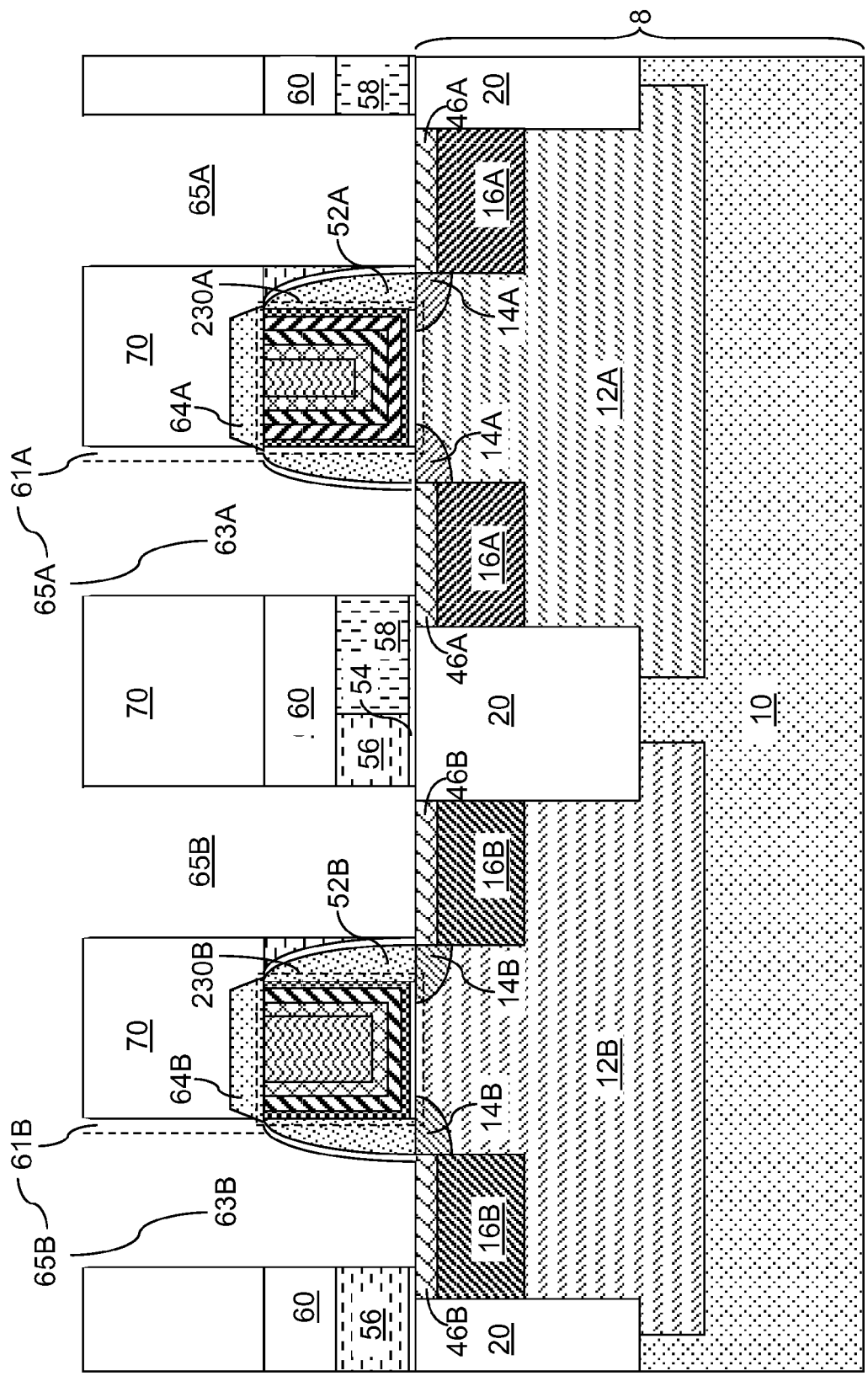
FIG. 10 is a vertical cross-sectional view of the first exemplary structure of FIG. 9 after formation of a contact-level dielectric layer and self-aligned via holes.

Referring to FIG. 10, a contact-level dielectric layer 70 is deposited over the planarization dielectric layer 60 and the gate cap dielectrics (64A, 64B) as a blanket layer, i.e., a layer without a pattern. The contact-level dielectric layer 70 includes a dielectric material such as silicon oxide, silicon nitride, and/or porous or non-porous organosilicate glass. The thickness of the contact-level dielectric layer 70 can be from 30 nm to 600 nm, although lesser and greater thicknesses can also be employed.

Via holes are formed through the contact-level dielectric layer 70, for example, by applying a photoresist (not shown) over the contact-level dielectric layer 70, lithographically patterning the photoresist, and transferring the pattern in the photoresist through the contact-level dielectric layer 70 and a modified pattern through the planarization dielectric layer 60 and, if present, the stress-generating liners (56, 58). The modified pattern in the planarization dielectric layer 60 and/ or in the stress-generating liners (56, 58) is caused by the presence of the dielectric gate spacers (52A, 52B) and the gate cap dielectrics (64A, 64B), which are not removed during the etch that forms the via holes (65A, 65B). The via holes can include first via holes 65A formed over the first device region including the second conductivity type well 12A and second via holes 65B formed over the second device region including the first conductivity type well 12B.

At least one of the via holes (65A, 65B) can be a via hole formed over a periphery of a gate cap dielectric (64A or 64B). In this case, a first portion (61A or 61B) of the via hole (65A or 65B) does not extend below the gate cap dielectric (64A or 64B) where the gate cap dielectric is present in a top-down view, and a second portion (63A or 63B) of the via hole (65A or 65B) extends into the planarization dielectric layer 60 where the gate cap dielectric (64A or 64B) is not present in the top-down view. The second portion (63A or 63B) of the via hole (65A or 65B) can extend to a top surface of the semiconductor substrate 8, which can be a top surface of metal semiconductor alloy portions (46A, 46B). By selecting the etch chemistry employed for formation of the via holes (65A, 65B) to be selective to the materials of the dielectric gate spacers (52A, 52B) and the gate cap dielectrics (64A, 64B), the via holes (65A, 65B) can be self-aligned to the dielectric gate spacers (52A, 52B) and the gate cap dielectrics (64A, 64B).

Figure 11:
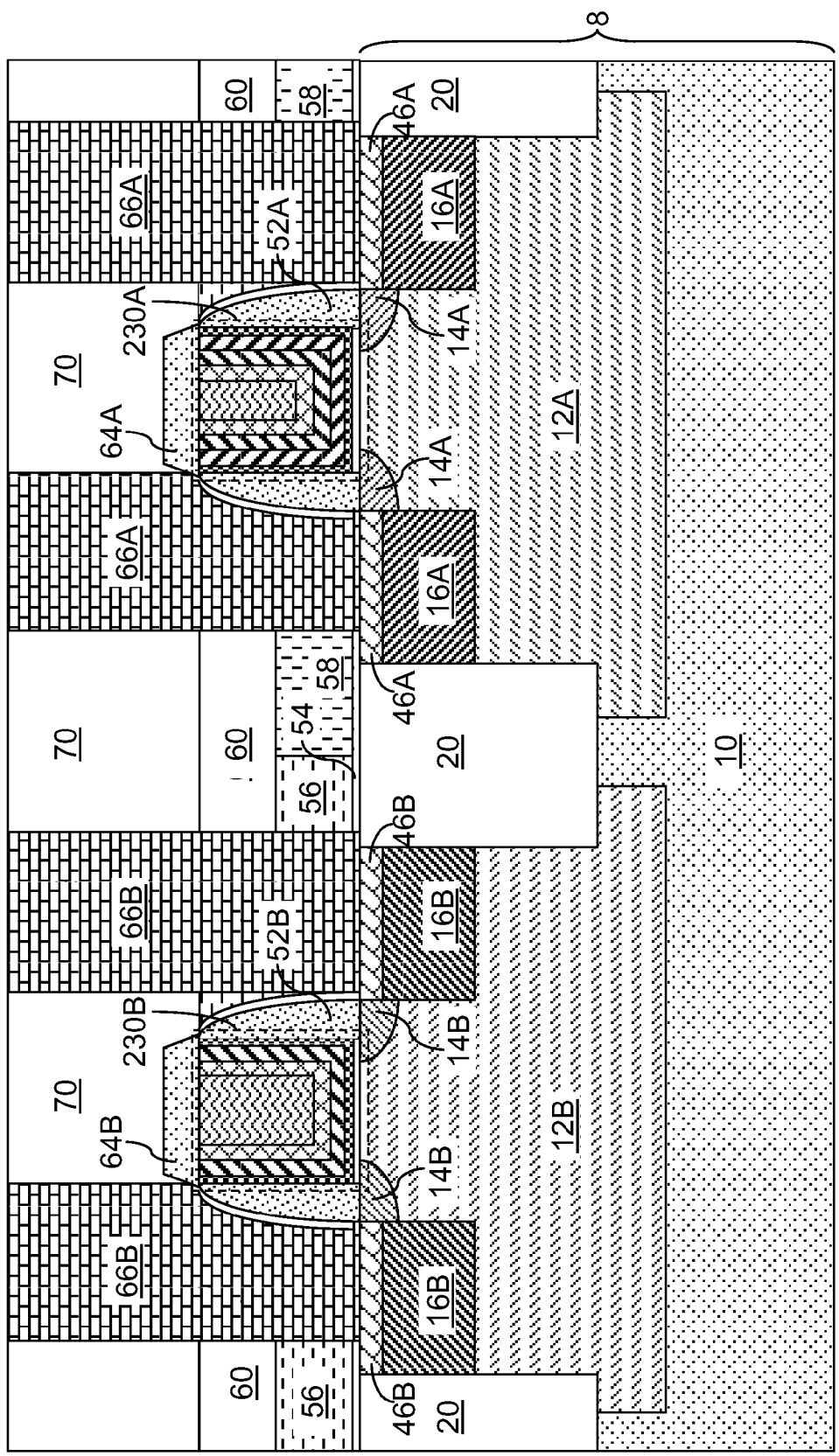
FIG. 11 is a vertical cross-sectional view of the first exemplary structure of FIG. 10 after formation of self-aligned contact via structures.

Referring to FIG. 11, self-aligned contact via structures (66A, 66B) are formed by filling the via holes (65A, 65B) with a conductive material and removing the portions of the conductive material deposited above the topmost surface of the contact-level dielectric material layer 70 by planarization employing, for example, chemical mechanical planarization and/or recess etch. Each gate electrode is spaced from the self-aligned contact via structures (66A, 66B) by the gate cap dielectrics (64A, 64B) and the dielectric gate spacers (52A, 52B). Thus, overlay variations during the lithographic process that defines the pattern of the via holes (65A, 65B) do not result in electrical shorts between the self-aligned contact via structures (66A, 66B) and the gate electrodes. When a portion of the self-aligned contact via structures (66A, 66B) in the contact-level dielectric layer 70 overlies a portion of the gate cap dielectrics (64A, 64B), such a portion of the self-aligned contact via structures (66A, 66B) contacts an upper surface of a peripheral portion of a gate cap dielectric (64A, 64B), and is spaced from the gate electrode by the gate cap dielectric (64A, 64B). The underlying portion(s) of such self-aligned contact via structures (66A, 66B) is/are laterally spaced from the nearest gate electrode by a dielectric gate spacer (52A, 52B). Thus, each self-aligned contact via structure (66A, 66B) is spaced from the nearest gate electrode by a gate cap dielectric (64A, 64B) and a dielectric gate spacer (52A, 52B). In some cases, one side of a self-aligned contact via structure (66A, 66B) contacts a gate cap dielectric (64A, 64B), and another side of the self-aligned contact via structure (66A, 66B) does not contact any gate cap dielectric (64A, 64B).

Figure 12:
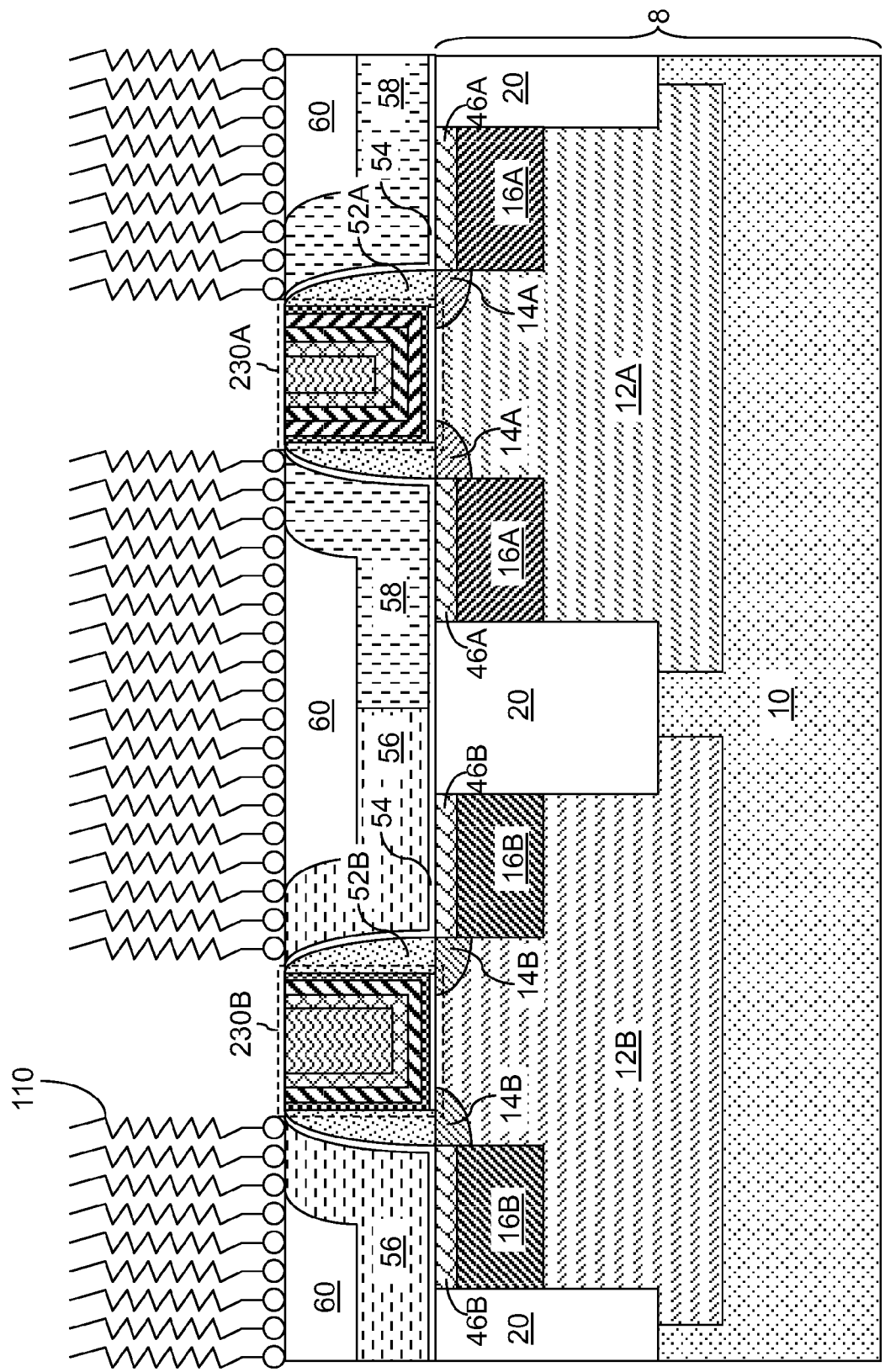
FIG. 12 is a vertical cross-sectional view of a second exemplary structure after formation of a self-assembling monolayer.

Referring to FIG. 12, a second exemplary structure according to a second embodiment of the present disclosure is derived from the first exemplary structure of FIG. 7 by forming a self-assembling monolayer 110. The self-assembling monolayer 110 is a monolayer of molecules that are selectively adsorbed on the dielectric surfaces of the planarization dielectric layer 60 and/or the stress-generating liners (56, 58), if present, while not adsorbing on any metallic surfaces such as the top surfaces of the gate electrodes.

The self-assembling monolayer 110 can be a polymer that selectively adsorbs to dielectric surfaces, while not adsorbing to non-dielectric surfaces. The dielectric surfaces and non-dielectric surfaces can be distinguished as hydrogen-terminated surfaces to which molecules of the self-assembling monolayer 110 do not attach and hydroxo-terminated surfaces to which molecules of the self-assembling monolayer 110 are attached. The top surface of the second exemplary structure Examples of molecules that can be employed for the self-assembling layer 110 include, but is not limited to, octadecyltrichlorosilane (ODTS), which is known to attach to the surface of silicon oxide, but is not attached to non-oxide surfaces such as metallic surfaces and semiconductor surfaces. See R. Chen, H. Kim, P. C. McIntye, D. W. Porter, S. F. Bent, Achieving area-selective atomic layer deposition on patterned substrates by selective surface modification, App. Phys. Lett, 86 (2005) 191910 and R. Chen and S. F. Bent, Chemistry for positive pattern transfer using area-selective atomic layer deposition, Adv. Mat., 18 (2006) 1086-1090.

The self-assembling monolayer 110 can be formed by dissolving molecules for the self-assembling layer 110 in a solvent, and immersing the first exemplary structure of FIG. 7 into the solvent. The molecules of the self-assembling monolayer 110 are self-aligned on the surfaces of the first exemplary structure of FIG. 7 such that the molecules of the self-assembling monolayer 110 cover all dielectric surfaces, while metallic surfaces are left exposed. After the second exemplary structure is subsequently removed from the solution, the self-assembling monolayer 110 is still present on the dielectric surfaces of the planarization dielectric layer 60 and/or the stress-generating liners (56, 58), if present. The thickness of the self-assembling monolayer 110 depends on the size of the molecules therein, and can be from 1 nm to 5 nm, although lesser and greater thicknesses can also be employed depending on the size of the molecules.

Each molecule of self-assembling monolayer 110 can be a linear chain of chemical groups including a first functional group, which is herein referred to as a proximal group, located at one end of the linear chain and a second functional group, which is herein referred to as a distal group, located at the opposite end of the linear chain. The proximal group has chemical affinity to dielectric materials such as silicon oxide and/or silicon oxide and is attracted to dielectric surfaces, while not being attracted to the metallic surfaces of the gate electrodes. The distal group does not attach to dielectric surfaces or metallic surfaces. Further, the distal group is a functional group that does not allow adsorption of oxygen or a metal during an atomic layer deposition process to be subsequently employed. The molecules of the self-assembling monolayer 110 are adsorbed only on the dielectric surfaces of the planarization dielectric layer 60 and/or the stress-generating liners (56, 58) such that the proximal group is attached to the dielectric surfaces, while the distal group is exposed on the outer surface of the self-assembling monolayer 110.

Figure 13:
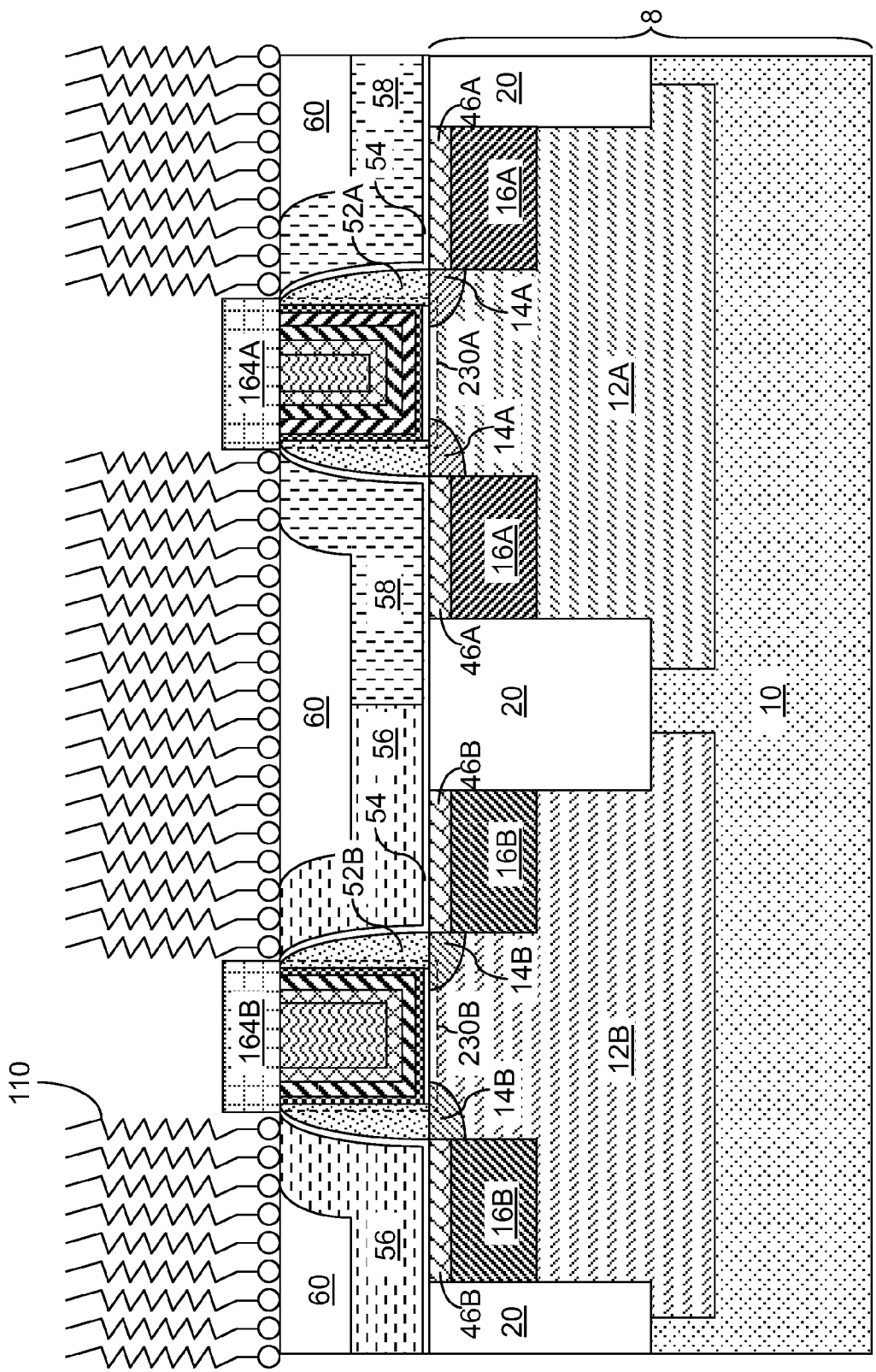
FIG. 13 is a vertical cross-sectional view of the second exemplary structure of FIG. 12 after selective deposition of gate cap dielectrics.

Referring to FIG. 13, gate cap dielectrics are selectively formed on the metallic surfaces of the gate electrodes. The gate cap dielectrics include a first gate cap dielectric 164A formed on the first gate electrode and a second gate cap dielectric 164B formed on the second gate electrode.

In one embodiment, the gate cap dielectrics (164A, 164B) can be formed by selectively depositing a dielectric material while the self-assembling monolayer 110 is exposed, i.e., while the self-assembling monolayer 110 covers the dielectric surfaces of the planarization dielectric layer 60 and/or the stress-generating liners (56, 58). The selective deposition of the dielectric material can be effected by atomic layer deposition (ALD), in which a metallic precursor, i.e., a reactant gas including a transition metal, and an oxidant gas is alternately, i.e., sequentially but not concurrently, flowed into a reaction chamber in which the second exemplary structure is placed. The gate cap dielectrics (164A, 164B) are formed on the top metallic surfaces of the gate electrodes, while the gate cap dielectrics (164A, 164B) are not formed on or above the planarization dielectric layer 60 due to the presence of the self-assembling monolayer 110. Because the distal group of the molecules in the self-assembling monolayer 110 is a functional group that does not allow adsorption of oxygen or a metal, no material is deposited directly on the outer surface of the self-assembling layer 110 during the atomic layer deposition process. Thus, the gate cap dielectrics (164A, 164B) are portions of the dielectric material as deposited on the top metallic surfaces, and the dielectric material is not deposited on the self-assembling monolayer 110. In other words, deposition of a metal oxide occurs only on the exposed metallic surfaces of gate electrodes. If the metallic precursor includes a transition metal, the dielectric material can be an oxide of the transition metal. The oxidant gas can be oxygen, ozone, or a combination thereof. The thickness of the gate cap dielectrics (164A, 164B) can be from 1 nm to 10 nm, although lesser and greater thicknesses can also be employed.

Figure 14:
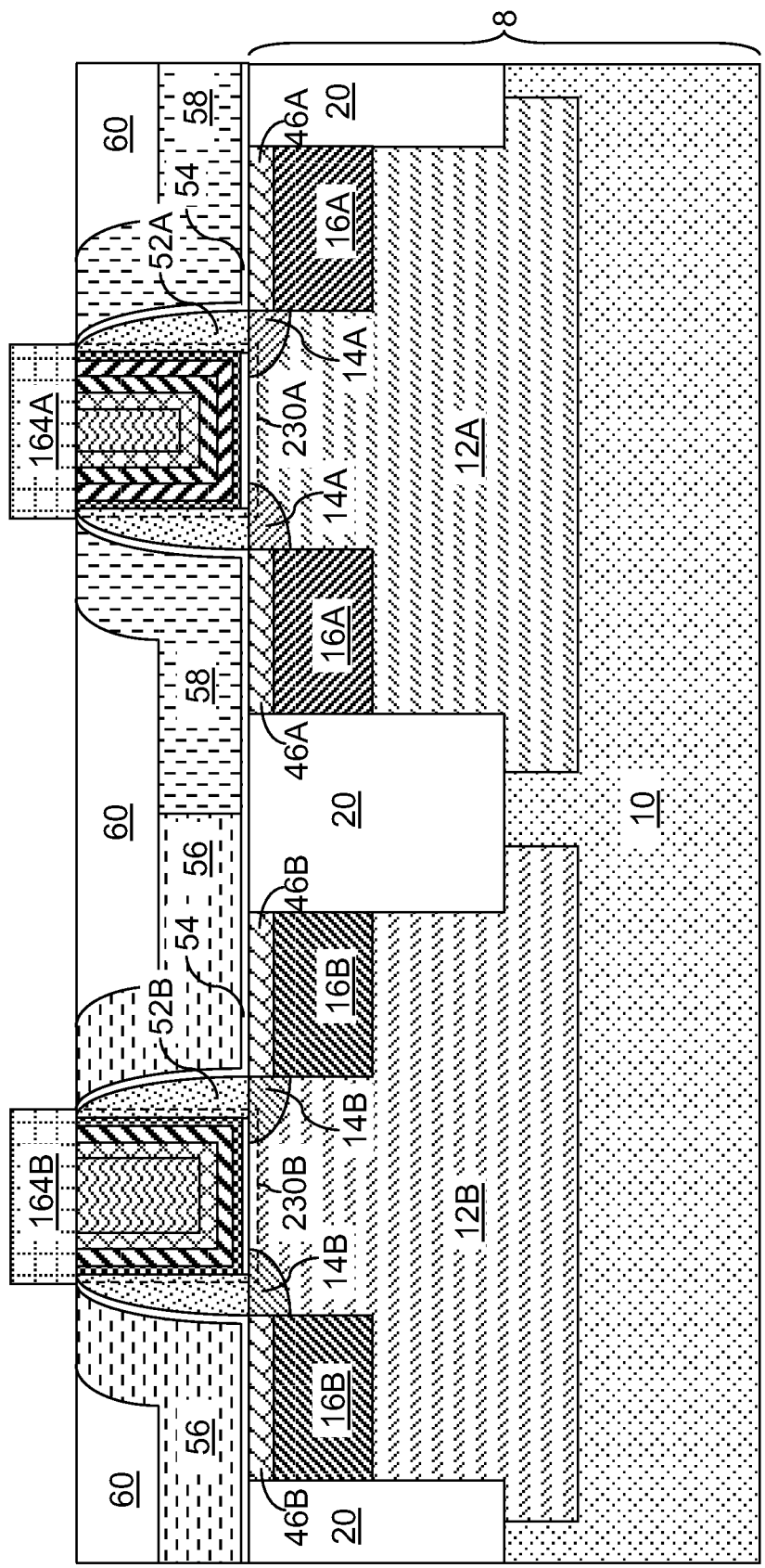
FIG. 14 is a vertical cross-sectional view of the second exemplary structure of FIG. 13 after removal of the self-assembling monolayer.

Referring to FIG. 14, the self-assembling monolayer 110 is removed, for example, by immersing the second exemplary structure in a solvent that dissolves the molecules of the self-assembling monolayer 110.

Figure 15:
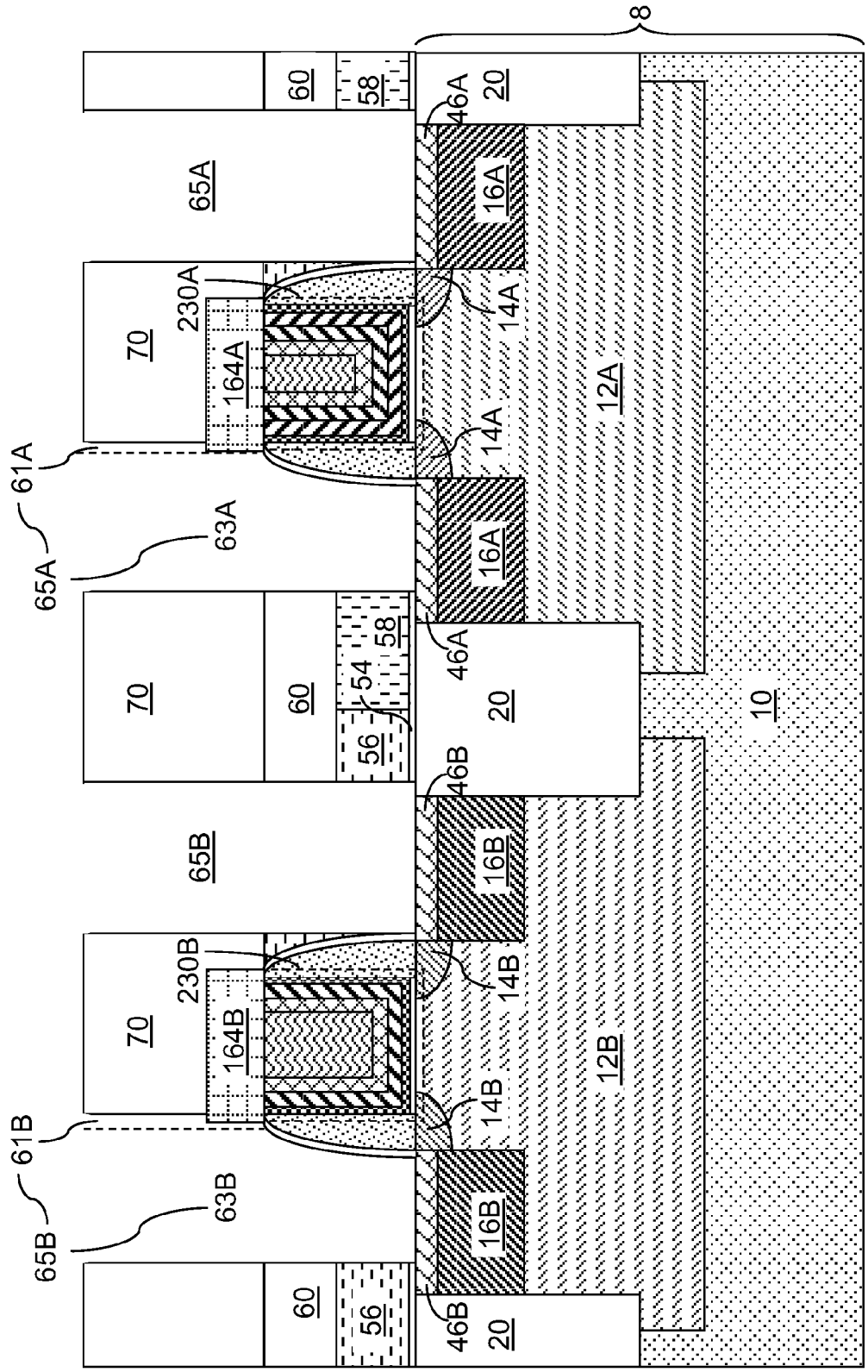
FIG. 15 is a vertical cross-sectional view of the second exemplary structure of FIG. 14 after formation contact-level dielectric layer and self-aligned via holes.

Referring to FIG. 15, a contact-level dielectric layer 70 is deposited over the planarization dielectric layer 60 and the gate cap dielectrics (164A, 164B) in the same manner as in the first embodiment. Via holes are formed through the contact-level dielectric layer 70, for example, by applying a photoresist (not shown) over the contact-level dielectric layer 70, lithographically patterning the photoresist, and transferring the pattern in the photoresist through the contact-level dielectric layer 70 and a modified pattern through the planarization dielectric layer 60 and, if present, the stress-generating liners (56, 58). The modified pattern in the planarization dielectric layer 60 and/or in the stress-generating liners (56, 58) is caused by the presence of the dielectric gate spacers (52A, 52B) and the gate cap dielectrics (164A, 164B), which are not removed during the etch that forms the via holes (65A, 65B). The via holes can include first via holes 65A formed over the first device region including the second conductivity type well 12A and second via holes 65B formed over the second device region including the first conductivity type well 12B.

As in the first embodiment, at least one of the via holes (65A, 65B) can be a via hole formed over a periphery of a gate cap dielectric (164A or 164B). In this case, a first portion (61A or 61B) of the via hole (65A or 65B) does not extend below the gate cap dielectric (64A or 64B) where the gate cap dielectric is present in a top-down view, and a second portion (63A or 63B) of the via hole (65A or 65B) extends into the planarization dielectric layer 60 where the gate cap dielectric (164A or 164B) is not present in the top-down view. The second portion (63A or 63B) of the via hole (65A or 65B) can extend to a top surface of the semiconductor substrate 8, which can be a top surface of metal semiconductor alloy portions (46A, 46B). By selecting the etch chemistry employed for formation of the via holes (65A, 65B) to be selective to the materials of the dielectric gate spacers (52A, 52B) and the gate cap dielectrics (164A, 164B), the via holes (65A, 65B) can be self-aligned to the dielectric gate spacers (52A, 52B) and the gate cap dielectrics (64A, 64B).

Figure 16:
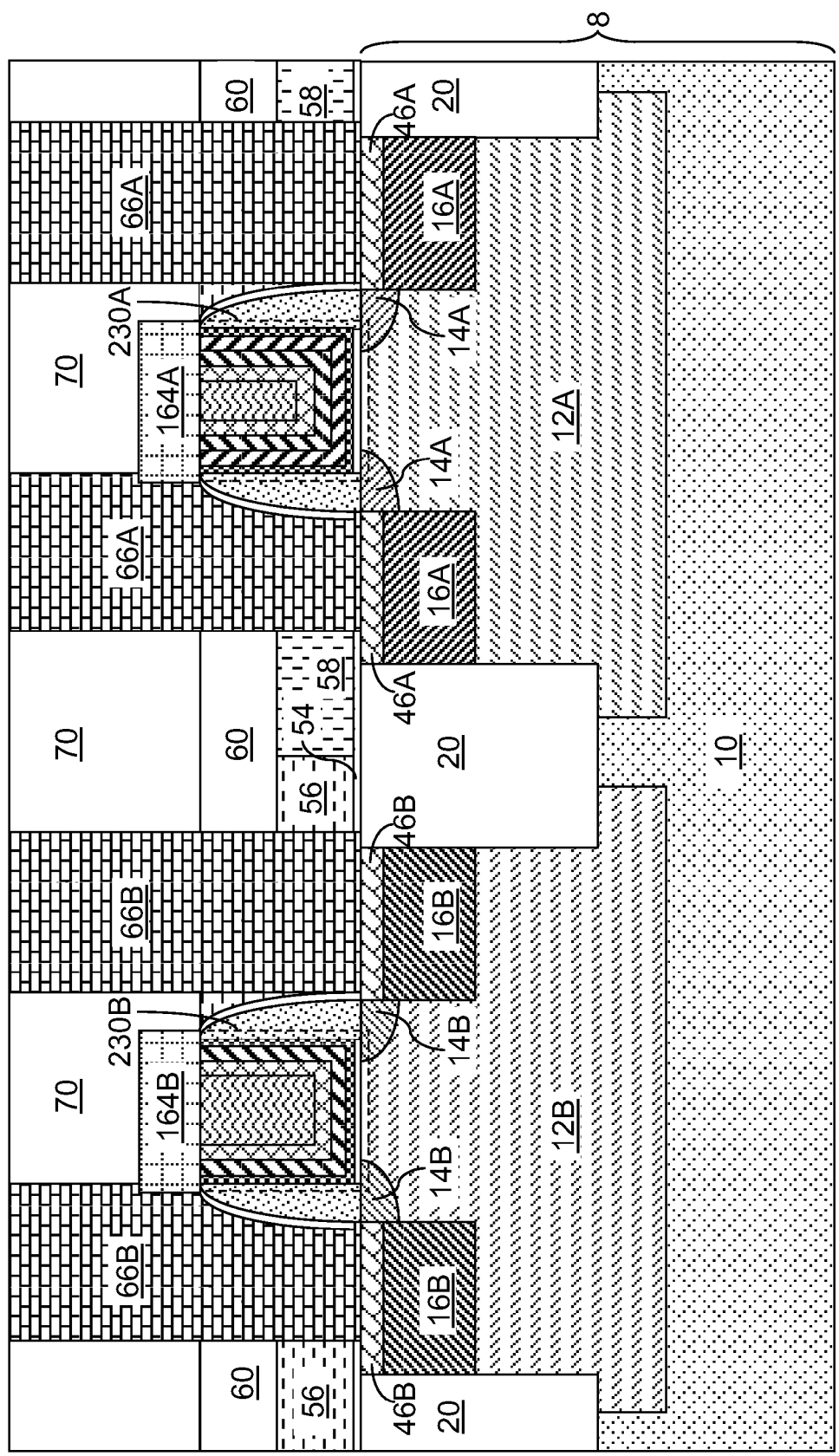
FIG. 16 is a vertical cross-sectional view of the second exemplary structure of FIG. 15 after formation of self-aligned contact via structures.

Referring to FIG. 16, self-aligned contact via structures (66A, 66B) are formed by filling the via holes (65A, 65B) with a conductive material and removing the portions of the conductive material deposited above the topmost surface of the contact-level dielectric material layer 70 by planarization employing, for example, chemical mechanical planarization and/or recess etch. Each gate electrode is spaced from the self-aligned contact via structures (66A, 66B) by the gate cap dielectrics (164A, 164B) and the dielectric gate spacers (52A, 52B). Thus, overlay variations during the lithographic process that defines the pattern of the via holes (65A, 65B) do not result in electrical shorts between the self-aligned contact via structures (166A, 166B) and gate electrodes. When a portion of the self-aligned contact via structures (66A, 66B) in the contact-level dielectric layer 70 overlies a portion of the gate cap dielectrics (164A, 164B), such a portion of the self-aligned contact via structures (66A, 66B) contacts an upper surface of a peripheral portion of a gate cap dielectric (164A, 164B), and is spaced from the gate electrode by the gate cap dielectric (164A, 164B). The underlying portion(s) of such self-aligned contact via structures (66A, 66B) is/are laterally spaced from the nearest gate electrode by a dielectric gate spacer (52A, 52B). Thus, each self-aligned contact via structure (66A, 66B) is spaced from the nearest gate electrode by a gate cap dielectric (164A, 164B) and a dielectric gate spacer (52A, 52B). In some cases, one side of a self-aligned contact via structure (66A, 66B) contacts a gate cap dielectric (164A, 164B), and another side of the self-aligned contact via structure (66A, 66B) does not contact any gate cap dielectric (164A, 164B).

Figure 17:
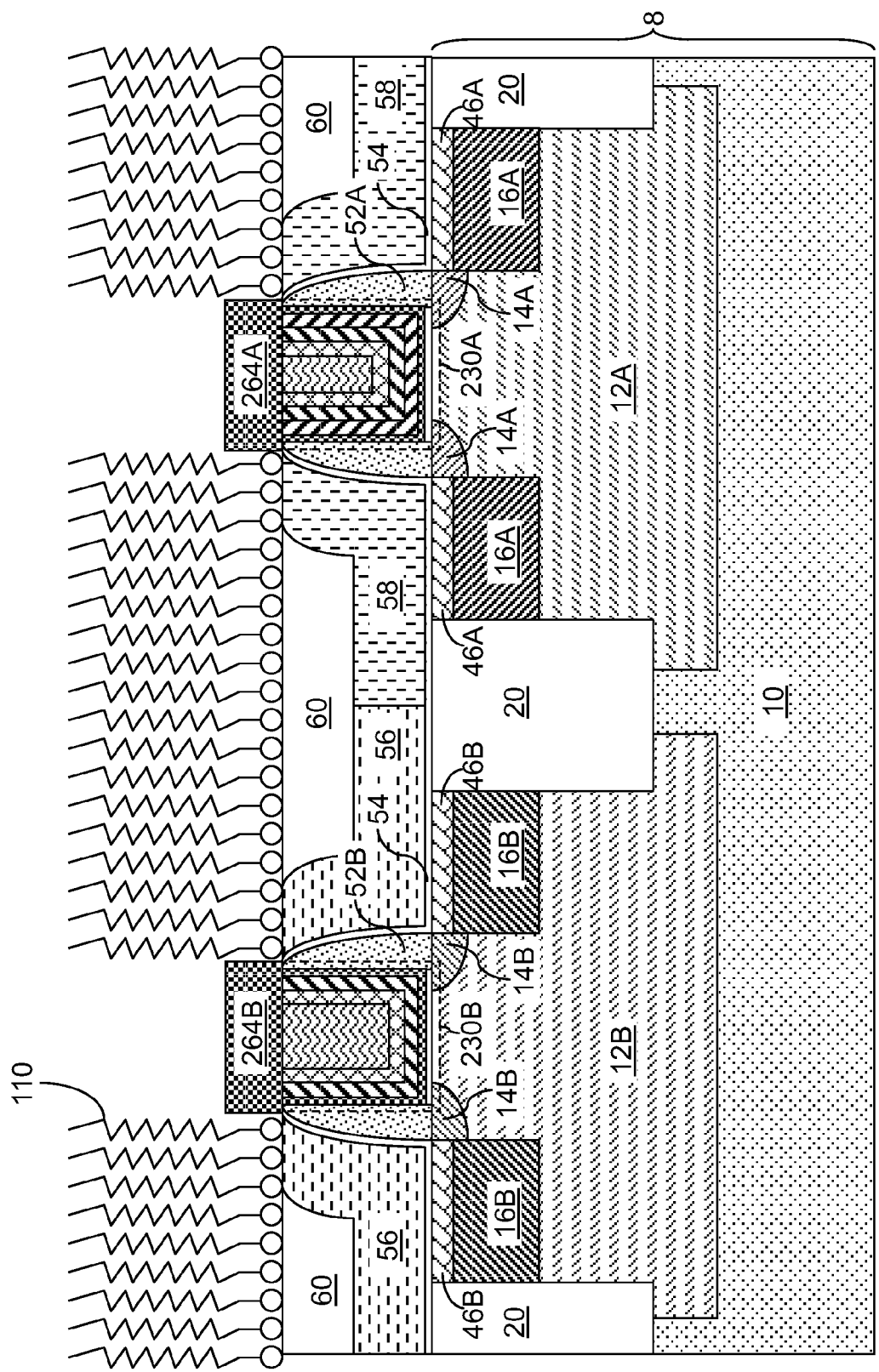
FIG. 17 is a vertical cross-sectional view of a third exemplary structure after formation of a self-assembling layer and selective deposition of gate cap metal portions.

Referring to FIG. 17, a third exemplary structure according to a third embodiment of the present disclosure is derived from the first exemplary structure of FIG. 7 by forming a self-assembling monolayer 110 in the same manner as described in the second embodiment. See FIG. 12 and corresponding paragraphs.

After formation of the self-assembling monolayer 110, gate cap metal portions are formed by selectively depositing a metal on surfaces that are not covered by the self-assembling monolayer 110. The gate cap metal portions can include, for example, a first gate cap metal portion 264A and a second gate cap metal 264B. The selective deposition of the metal can be effected by chemical vapor deposition (CVD) in which a metallic precursor, i.e., a reactant gas including a transition metal is flowed into a reaction chamber in which the third exemplary structure is placed. The material of the self-assembling layer 110 is selected so that the metal is not deposited directly on the self-assembling layer 110. The gate cap metal portions (264A, 264B) are formed on the top metallic surfaces of the gate electrodes, but are not formed on or above the planarization dielectric layer 60 due to the presence of the self-assembling monolayer 110. This can be effected by selecting the material for the self-assembling layer 110 to include a distal functional group, i.e., a functional group located at the topmost surface of the self-assembling layer 110, that does not allow adsorption of metal during the chemical vapor deposition. The thickness of the gate cap metal portions (264A, 264B) can be from 1 nm to 10 nm, although lesser and greater thicknesses can also be employed.

Figure 18:
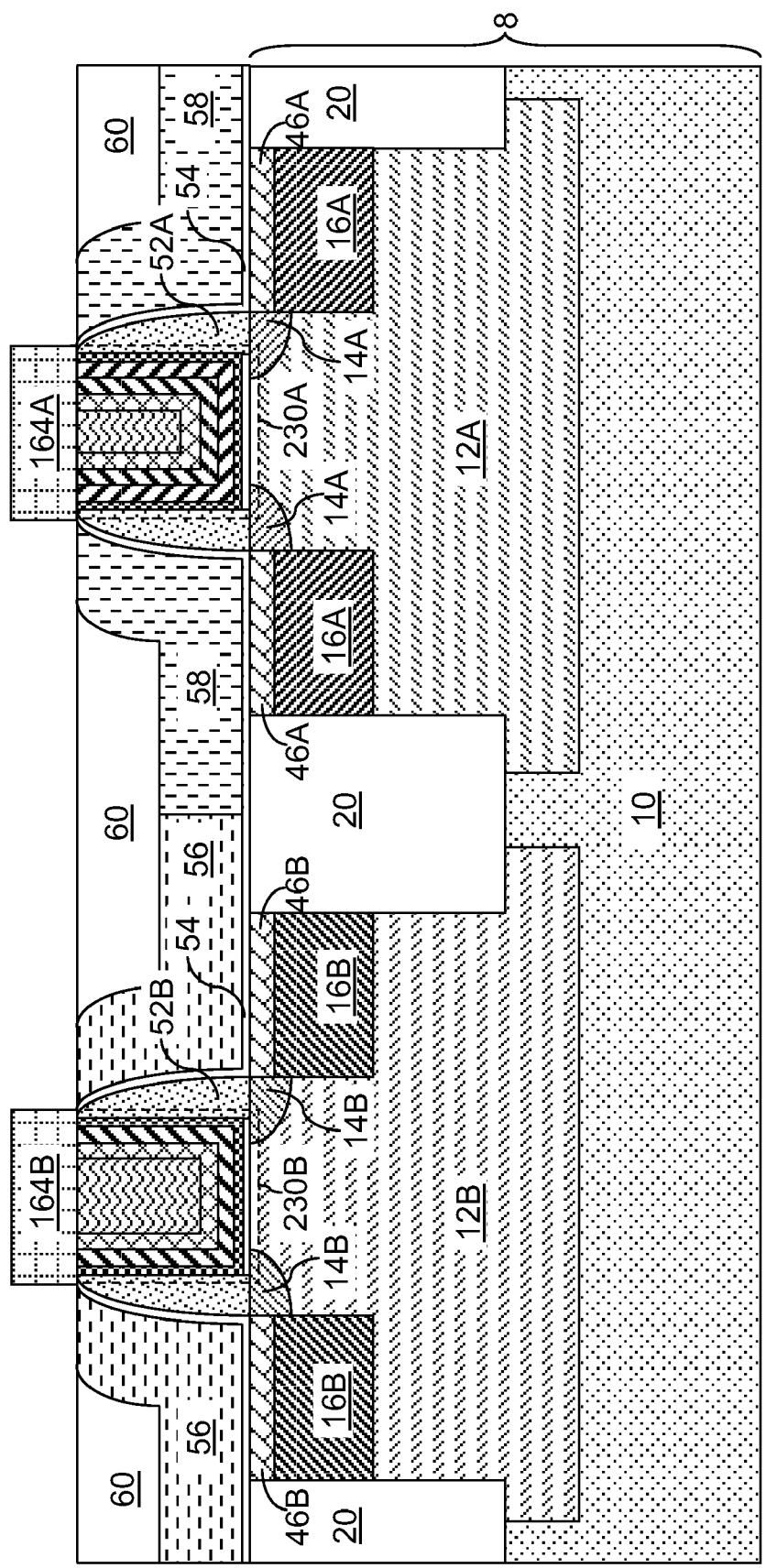
FIG. 18 is a vertical cross-sectional view of the third exemplary structure after removal of the self-assembling monolayer and conversion of the gate cap metal portions into gate cap dielectrics.

Referring to FIG. 18, the self-assembling monolayer 110 is removed, for example, employing a wet etch. The gate cap metal portions (264A, 264B) are converted into gate cap dielectrics, which can include a first gate cap dielectric 164A and a second gate cap dielectric 164B. The conversion of the gate cap metal portions (264A, 264B) into the gate cap dielectrics (164A, 164B) can be effected by thermal oxidation, thermal nitridation, plasma oxidation, and/or plasma nitridation. The gate cap dielectrics (164A, 164B) include a dielectric oxide of a metal or a dielectric nitride of a metal.

Subsequently, processing steps of FIGS. 15-16 are performed in the same manner as in the second embodiment.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:

forming a gate electrode and a planarization dielectric layer on a semiconductor substrate, wherein a top metallic surface of said gate electrode is coplanar with a top surface of said planarization dielectric layer;

selectively forming a gate cap dielectric on said top metallic surface of said gate electrode, while said gate cap dielectric is not formed on or above said planarization dielectric layer;

forming a contact-level dielectric layer over said gate cap dielectric and said planarization dielectric layer; and forming a via hole through said contact-level dielectric layer over a periphery of said gate cap dielectric, wherein a first portion of said via hole does not extend below said gate cap dielectric where said gate cap dielectric is present, and a second portion of said via hole extends into said planarization dielectric layer where said gate cap dielectric is not present.

2. The method of claim 1, wherein said gate cap dielectric is an oxide of an elemental metal selected from W, Re, Ta, Mo, Y, La, and Nd.

3. The method of claim 1, wherein said second portion of said via hole extends to a top surface of said semiconductor substrate, and said method further comprises forming a contact via structure by filling said via hole with a conductive material, wherein said gate electrode is spaced from said contact via structure by said gate cap dielectric.

4. The method of claim 1, wherein said gate cap dielectric is formed by:
selectively depositing a metal portion on said top metallic surface; and
converting said metal portion into said gate cap dielectric.

5. The method of claim 4, wherein said metal portion is deposited by electroplating or electroless plating.

6. The method of claim 4, wherein said metal portion is converted to said gate cap dielectric by oxidizing said metal portion.

7. The method of claim 4, wherein said metal portion is converted to said gate cap dielectric by anodization.

8. The method of claim 1, further comprising:
selectively depositing a self-assembling monolayer on a top surface of said planarization dielectric layer, wherein said self-assembling monolayer is not formed on said top surface; and
selectively depositing a dielectric material while said self-assembling monolayer is exposed, wherein said gate cap dielectric is a portion of said dielectric material as deposited on said top metallic surface, and said dielectric material is not deposited on said self-assembling monolayer.

9. The method of claim 8, further comprising removing said self-assembling monolayer before forming said contact-level dielectric layer.

10. The method of claim 8, wherein said dielectric material is an oxide of a transition metal.

11. The method of claim 8, wherein said dielectric material is deposited by atomic layer deposition (ALD) by alternatively flowing a reactant gas including a transition metal and an oxidant gas.

12. The method claim 1, wherein said gate electrode is a replacement gate electrode formed by:

forming a disposable gate structure on said semiconductor substrate; and replacing said disposable gate structure with a gate dielectric and at least one conductive material, wherein said gate electrode is a remaining portion of said at least one conductive material after removing said at least one conductive material from above a top surface of said planarization dielectric layer.

13. The method of claim 12, further comprising:
forming a dielectric gate spacer on sidewalls of said disposable gate structure; and
forming a contact via structure through said contact-level dielectric layer and said planarization dielectric layer, wherein said contact via structure is spaced from said gate electrode by said gate cap dielectric and said dielectric gate spacer.

14. A semiconductor structure comprising:
a gate electrode located on a semiconductor substrate;
a planarization dielectric layer laterally surrounding said gate electrode;
a gate cap dielectric comprising an oxide of a transition metal;
a contact-level dielectric layer overlying said planarization dielectric layer and said gate cap dielectric; and
a contact via structure extending through said contact-level dielectric layer and said planarization dielectric layer, contacting an upper surface of a peripheral portion of said gate cap dielectric, and spaced from said gate electrode by said gate cap dielectric.

15. The semiconductor structure of claim 14, wherein a top surface of said planarization dielectric layer is coplanar with a top metallic surface of said gate electrode.

16. The semiconductor structure of claim 14, wherein one side of said contact via structure contacts said gate cap dielectric, and another side of said contact via structure does not contact said gate cap dielectric.

17. The semiconductor structure of claim 14, wherein said gate cap dielectric includes an oxide of an elemental metal selected from W, Re, Ta, Mo, Y, La, and Nd.

18. The semiconductor structure of claim 14, further comprising a dielectric gate spacer laterally surrounding said gate electrode, wherein said contact via structure is spaced from said gate electrode by said gate cap dielectric and said dielectric gate spacer.

19. The semiconductor structure of claim 14, wherein said gate dielectric is a U-shaped gate dielectric having a horizontal portion and a vertical portion that contacts a lower surface of said gate cap dielectric.

20. The semiconductor structure of claim 19, wherein said gate dielectric has a dielectric constant greater than 8.0.

* * * * *